United States Patent
Forse et al.

(10) Patent No.: US 7,202,747 B2
(45) Date of Patent: Apr. 10, 2007

(54) SELF-TUNING VARIABLE IMPEDANCE CIRCUIT FOR IMPEDANCE MATCHING OF POWER AMPLIFIERS

(75) Inventors: Roger J Forse, Santa Barbara, CA (US); Vicki Chen, Goleta, CA (US); Robert A York, Santa Barbara, CA (US); David R Chase, Santa Barbara, CA (US)

(73) Assignee: Agile Materials and Technologies, Inc., Goleta, CA (US)

( * ) Notice: Subject to any disclaimer, the term of this patent is extended or adjusted under 35 U.S.C. 154(b) by 29 days.

(21) Appl. No.: 10/913,698

(22) Filed: Aug. 5, 2004

(65) Prior Publication Data

US 2005/0130608 A1 Jun. 16, 2005

Related U.S. Application Data

(60) Provisional application No. 60/493,031, filed on Aug. 5, 2003.

(51) Int. Cl.
*H03F 3/191* (2006.01)

(52) U.S. Cl. .................. 330/305; 330/144; 330/305
(58) Field of Classification Search ............... 330/305, 330/302
See application file for complete search history.

(56) References Cited

U.S. PATENT DOCUMENTS

| 6,160,449 A | 12/2000 | Klomsdorf et al. |
| 6,252,456 B1 | 6/2001 | Baker et al. |
| 6,349,216 B1 | 2/2002 | Alberth, Jr. et al. |
| 6,608,603 B2* | 8/2003 | Alexopoulos et al. ...... 330/144 |
| 6,710,679 B2* | 3/2004 | Zhu ........................ 333/164 |
| 6,731,175 B1* | 5/2004 | Chen ........................ 330/311 |

* cited by examiner

*Primary Examiner*—Khanh Van Nguyen
(74) *Attorney, Agent, or Firm*—Fenwick & West LLP

(57) ABSTRACT

A self-tuning variable impedance circuit provides improved performance. A variation in the power applied to the variable impedance circuit causes a corresponding change in the impedance of the circuit, resulting in improved performance. For example, the variable impedance circuit may be a matching circuit that "follows" the output power of a power amplifier, thereby increasing the power efficiency of the power amplifier.

18 Claims, 24 Drawing Sheets

# SELF-TUNING VARIABLE IMPEDANCE CIRCUIT FOR IMPEDANCE MATCHING OF POWER AMPLIFIERS

CROSS-REFERENCE TO RELATED APPLICATION

This application claims priority under 35 U.S.C. § 119(e) to U.S. Provisional Patent Application Ser. No. 60/493,031, "Self-Tuning Variable Impedance Circuit for Impedance Matching of Power Amplifiers," filed Aug. 5, 2003 by Roger J. Forse. The subject matter of the foregoing is incorporated herein by reference in its entirety.

BACKGROUND OF THE INVENTION

1. Field of the Invention

This invention relates generally to self-tuning variable impedance circuits, for example as may be used for impedance matching of power amplifiers.

2. Description of the Related Art

Power amplifiers are a commonly used component in many types of systems. For example, the recent increase in wireless systems (e.g., the cellular phone network) has resulted in a corresponding increase in wireless handsets. Within these handsets, power amplifiers are commonly used to boost signal powers and can account for a significant fraction of the overall power used by the handset. As a result, it is desirable to reduce the amount of power consumed by power amplifiers, particularly in mobile devices where power consumption limits characteristics such as battery life, talk time and standby time. However, if a power amplifier is required to boost signal power by a certain amount, the amplifier's consumption cannot be straightforwardly reduced simply by feeding less power to the amplifier. Rather, the efficiency of the power amplifier need be improved, thus achieving the same signal boost with less consumed power.

One way of increasing the efficiency of a power amplifier is to match the load impedance to the power amplifier. However, the optimal matching impedance typically varies as a function of the signal power. For a higher power output from the amplifier, a lower impedance typically results in higher efficiency. In contrast, for a lower power output, a higher impedance typically results in higher efficiency.

In one common approach, the load impedance is designed for optimal efficiency at the highest power output for the power amplifier. However, this results in less than optimal efficiency at lower powers. In another approach, the power output of the amplifier is detected and a control circuit actively changes the load impedance to match. However, this approach requires a control algorithm, which adds complexity. It also requires additional control circuitry, which adds to the overall power consumption. In another approach, two different load impedances are used, one for higher output powers and one for lower output powers. The power amplifier is switched between the two, depending on the actual output power. This approach has the drawbacks of both of the previous approaches. It requires additional circuitry to control the switching. It also is not optimal for many output powers since, for example, neither load impedance will be optimal for intermediate output powers.

Thus, there is a need for an approach that provides a variable impedance circuit, as may be used for impedance matching to power amplifiers. The variable impedance circuit preferably is also inexpensive with low power consumption.

SUMMARY OF THE INVENTION

The present invention overcomes the limitations of the prior art by providing a variable impedance circuit that contains a self-tuning voltage-variable capacitor. A variation in the RF power applied to the variable impedance circuit causes a corresponding change in the capacitance of the voltage-variable capacitor and the impedance of the impedance matching circuit.

For example, the variable impedance circuit can be designed to automatically "follow" the output power of a power amplifier, thereby increasing its power efficiency. In one approach, an increase in output power or applied voltage causes a decrease in capacitance of the voltage-variable capacitor or a decrease in the impedance of the impedance matching circuit, resulting in better matching and improved power efficiency of the power amplifier. In some cases, the matching that is achieved by self-tuning may not result in the maximum possible matching and may be augmented by a control circuit that actively tunes the impedance matching circuit to further improve the matching.

In one implementation, the variable impedance circuit includes a self-tuning BST parallel plate varactor. A RF voltage applied across the BST varactor (e.g., as may be the result of high output power from a power amplifier) causes a decrease in the capacitance of the BST parallel plate varactor, for example due to the nonlinear behavior of the BST material. This, in turn, results in an increase in the RF power efficiency of the power amplifier. Such circuitry can be used in wireless applications.

Other aspects of the invention include methods, circuits and systems related to the circuits described above.

BRIEF DESCRIPTION OF THE DRAWING

The invention has other advantages and features which will be more readily apparent from the following detailed description of the invention and the appended claims, when taken in conjunction with the accompanying drawing, in which:

FIG. 3 is a diagram of the circuit on which FIGS. 4–5 are based.

DETAILED DESCRIPTION OF THE PREFERRED EMBODIMENTS

Figure 1:
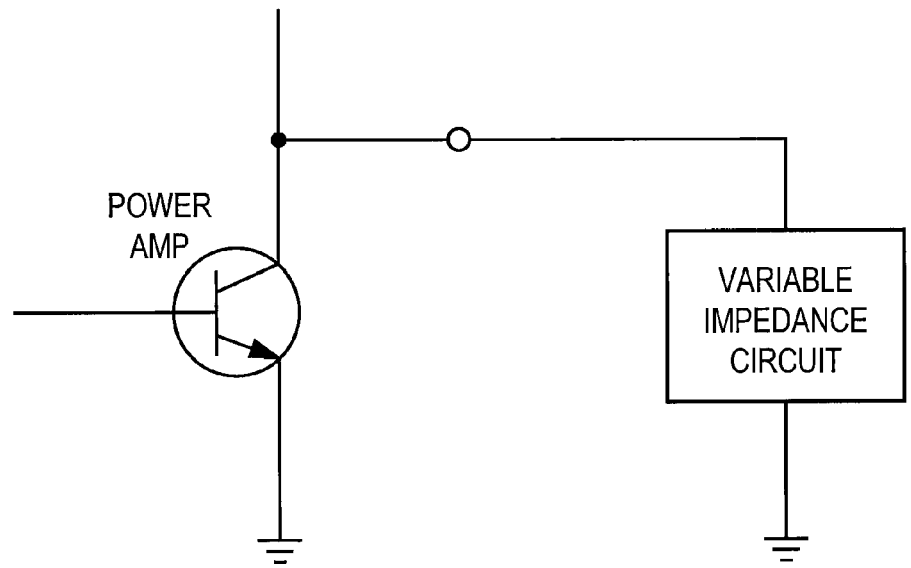
FIG. 1 is a block diagram of a circuit including the present invention.

FIG. 1 shows a power amplifier coupled to a variable impedance circuit that is used for impedance matching the power amplifier. The impedance matching circuit includes a self-tuning voltage-variable capacitor. As a result, the impedance of the circuit is variable and self-tunes, as described below, to match the power amplifier.

The power applied across the capacitor induces a change in the capacitance of the voltage-variable capacitor. The impedance matching circuit is designed so that, when the power amplifier has a high output power, the voltage-variable capacitor has a capacitance that makes the overall impedance of the circuit low, thus matching the power amplifier. When the power amplifier has a low output power, the voltage-variable capacitor has a capacitance that results in high overall impedance for the circuit, again matching the power amplifier. As the output power of the amplifier varies between low and high, the capacitance automatically varies in a corresponding fashion, and the impedance of the circuit varies from high to low. In this way, the variable impedance circuit self-tunes itself to match the output power of the power amplifier.

Preferably, the impedance of the matching circuit varies in a manner that optimizes the power efficiency of the power amplifier at all output powers. However, in many cases, this may not be easily achievable or required. In many implementations, the variable capacitance results in impedance that improves the power efficiency, although without reaching the optimal efficiency for all output powers. Even in these cases, significant improvement can be achieved.

Figure 2A:
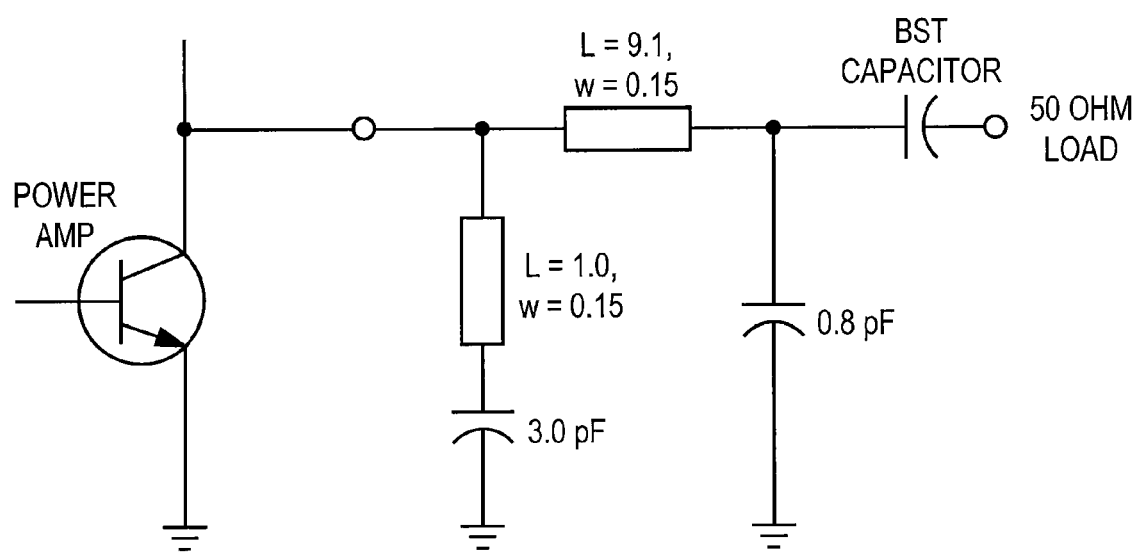
FIG. 2A is a diagram of one example of a self-tuning variable impedance circuit.

FIG. 2A is a diagram of one example of a self-tuning variable impedance circuit. Other circuits will be apparent. In this example, the matching circuit is coupled to a power amplifier on one end and to a 50 ohm load on the other. The circuit includes two strip lines (length 1.0 mm and width 0.15 mm for one, and length 9.1 mm and width 0.15 mm for the other), two fixed capacitors (3.0 pF and 0.8 pF) and a voltage-variable capacitor. The branch of the circuit with the 1.0 mm strip line achieves a short circuit at the second harmonic of the operating frequency, which is a typical characteristic for many applications. In this example, the voltage-variable capacitor is implemented as a BST thin-film capacitor. FIGS. 7–9 describe various example approaches for fabricating BST thin-film capacitors.

Figure 2B:
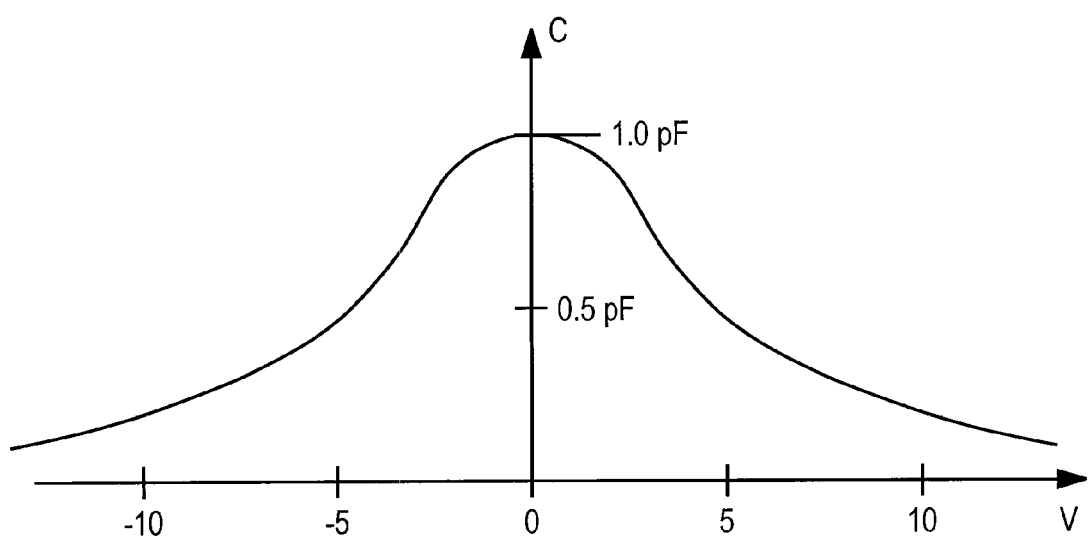
FIG. 2B is a graph of capacitance as a function of voltage, for a BST voltage-variable capacitor.
Figure 4A:
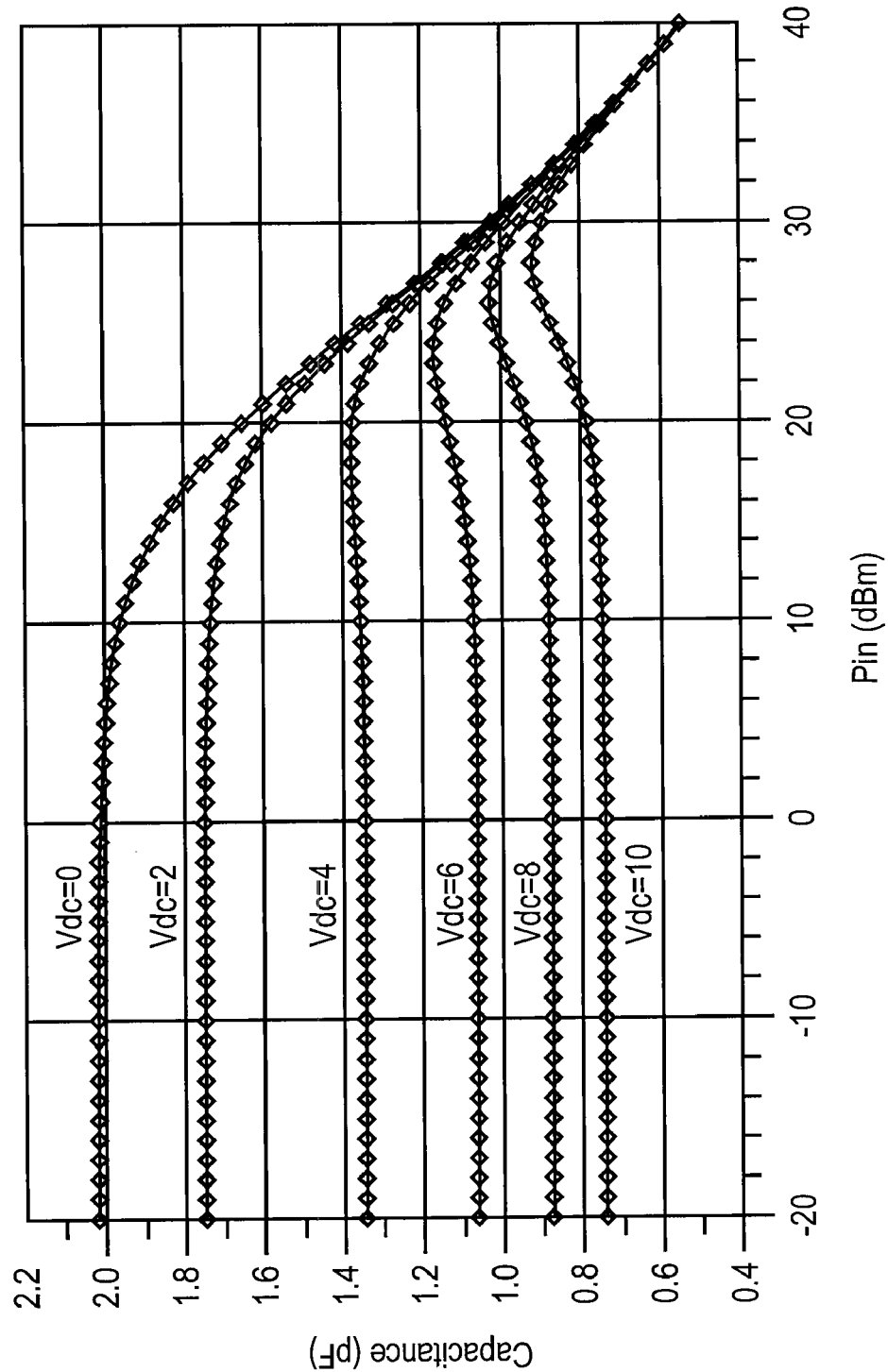
FIGS. 4A–4C are graphs illustrating the behavior of a BST varactor.
Figure 5A:
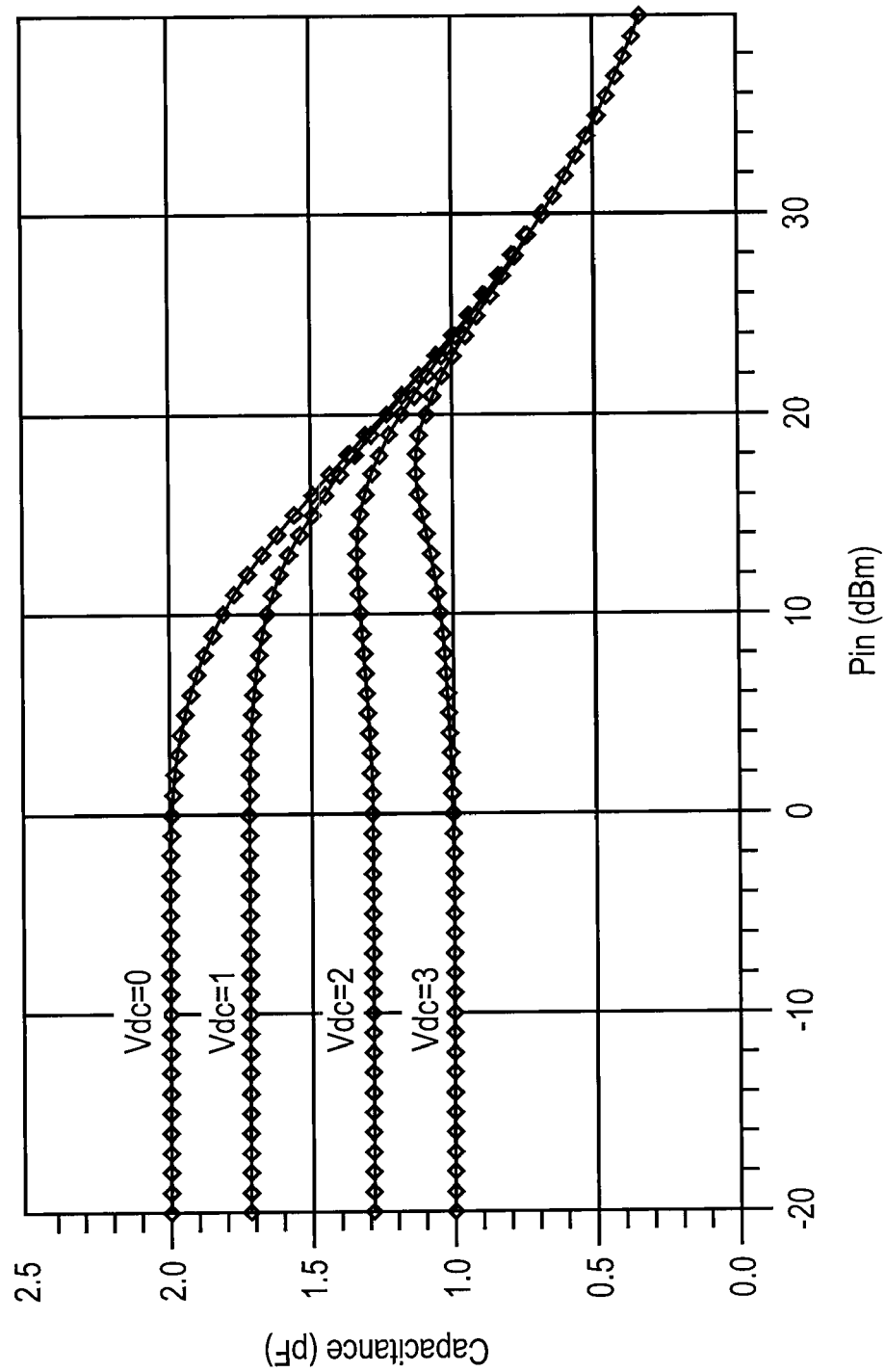
FIGS. 5A–5C are graphs illustrating the behavior of another BST varactor.

FIG. 2B is a graph of capacitance as a function of voltage, for a BST voltage-variable capacitor suitable for this example. The capacitor has high capacitance at low voltages and low capacitance at high voltages. In this particular example, the capacitor is designed to have a capacitance of 1.0 pF at zero output power, which corresponds to a 0 V swing. The capacitance is 0.5 pF at the maximum output power of about 1 watt, which corresponds to a RF voltage swing of +/−7 V. The BST capacitor can be designed to approximate the desired C-V curve by, for example, varying the film thickness and area. By varying the film thickness, the point at which the BST capacitance changes appreciably with RF power can be tailored for a given application circuit. FIGS. 4A and 5A show the behavior of the measured capacitance as a function of RF input power for a nominal 10V device and a nominal 3V device respectively. Thinner BST thicknesses result in a steeper C vs V tuning curve, which in turn translates into a lower RF input power required before the capacitance begins to decrease.

Figure 2C:
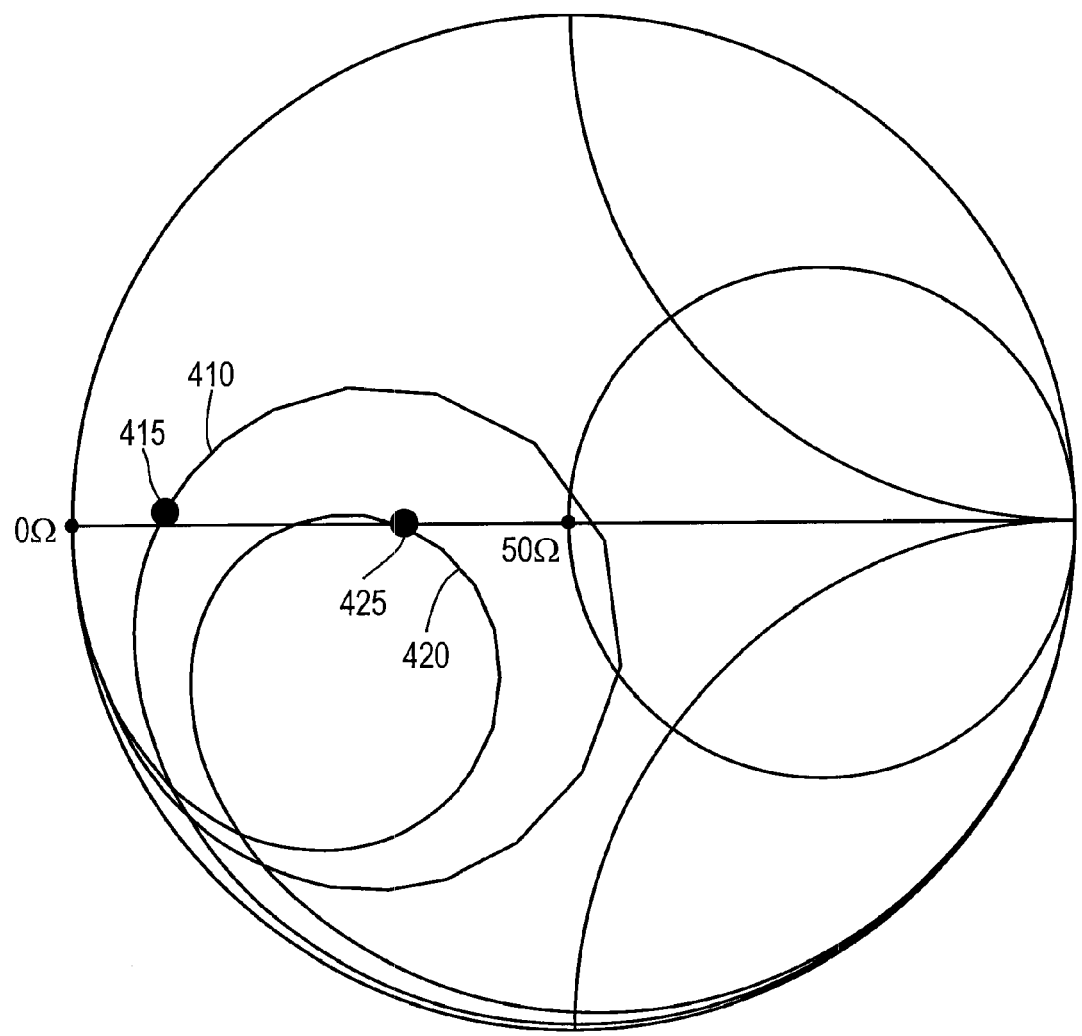
FIG. 2C is a Smith chart illustrating the performance of the circuit of FIG. 2A.

FIG. 2C is a Smith chart illustrating the performance of the circuit of FIG. 2. The curve 410 maps the impedance as a function of frequency at the maximum output power for the power amplifier. Curve 420 maps the impedance at the minimum output power. The two points 415 and 425 mark the impedances at the operating frequency, which in this example is 1.88 GHz. At point 415 (maximum output power), the BST capacitor is 0.47 pF and the impedance of the circuit is 5.0+1.0 j. At point 425 (minimum output power), the BST capacitor is 0.97 pF and the impedance of the circuit is 25.0+0.0 j. As the power varies from maximum to minimum, the BST capacitor varies from 0.47 pF to 0.97 pF and the overall impedance travels from point 415 to 425 in a clockwise direction approximately along a circular arc. In this way, the variable impedance circuit self-tunes itself to match the output power of the amplifier. When used in a CDMA power amplifier, for example, the impedance dynamically tracks the envelope amplitude, further increasing efficiency.

Additional tuning can be achieved by applying a bias voltage across the BST capacitor, and controlling the bias voltage to further tune the BST capacitor and the overall impedance of the circuit. In one approach, the output power of the power amplifier (or the overall efficiency) is sensed or supplied (e.g., by the power control chip in a wireless phone), and this is used to set the bias voltage. In an alternate approach, the bias voltage is dithered to maximize the efficiency. Other approaches will be apparent.

Figure 3:
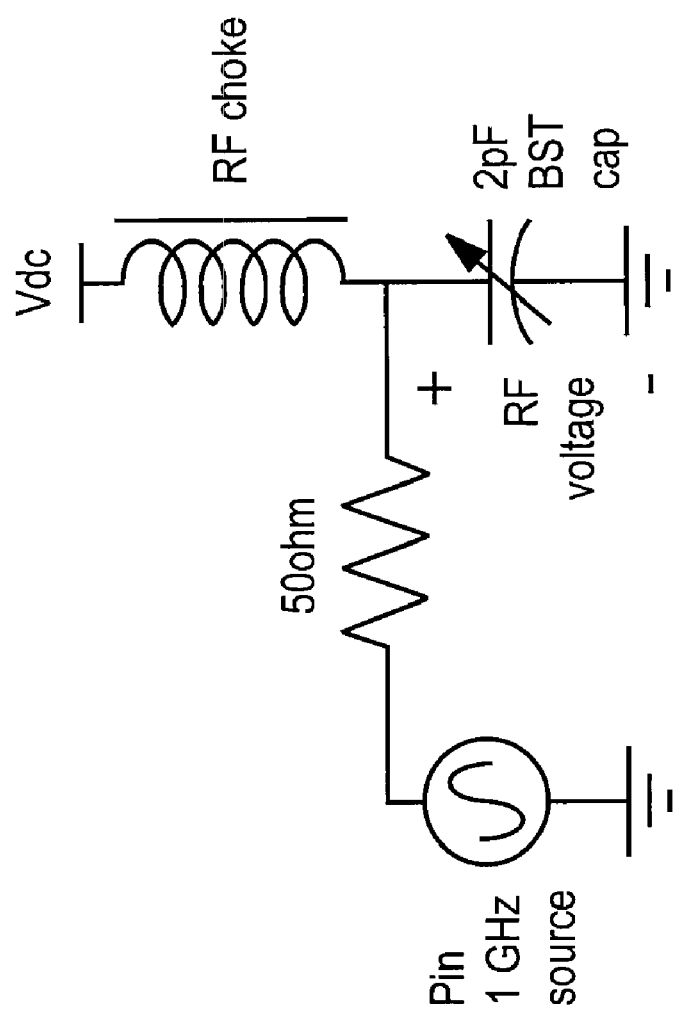

FIGS. 3–5 illustrate the behavior of certain BST varactors in greater detail graphs in FIGS. 4–5 are based on the circuit shown in FIG. 3. In this circuit, 1 GHz signal with a 50 ohm termination is used as the RF source and the DC bias voltage is applied via the RF choke. In FIG. 4, the BST varactor is nominally a 2 pF capacitor at 0 DC bias voltage and 0 RF power and is designed for tuning by DC bias voltages ranging from 0–10 V. In FIG. 5, the BST varactor is also nominally a 2 pF but is designed for tuning by DC bias voltages ranging from 0–3 V.

FIG. 4A is a graph showing the capacitance of the BST varactor as a function of applied DC bias voltage and RF input power. The BST varactor is tunable over a range of 2.7:1 (i.e., from 2.0 pF to slightly above 0.7 pF) for DC bias voltages ranging from 0 to 10 V. The far right of each curve (circled in FIG. 4A) contains a downward sloping portion that is the result of the nonlinear behavior of the BST varactor at high electric field values (caused by high RF power in this example). The downward slope means that the capacitance of the BST varactor decreases with increasing RF power. This characteristic can be used to self-tune a variable impedance circuit to impedance match a power amplifier.

Figures 4B, 4C:
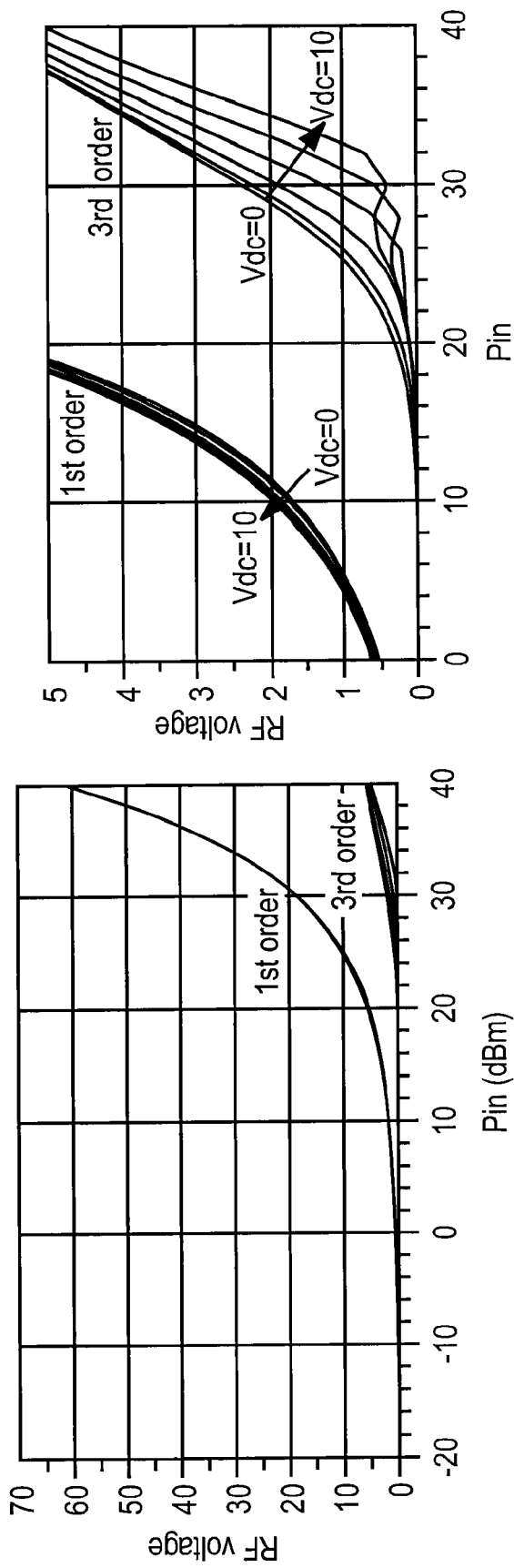

FIGS. 4B–4C show further detail of the nonlinear behavior of the BST varactor. In both of these graphs, "$1^{st}$ order" shows the strength of the fundamental component of the RF voltage and "3rd order" shows the strength of the 3rd order harmonic, which is a result of the nonlinear behavior. FIG. 4C is a blow-up of a portion of FIG. 4B.

Figures 5B, 5C:
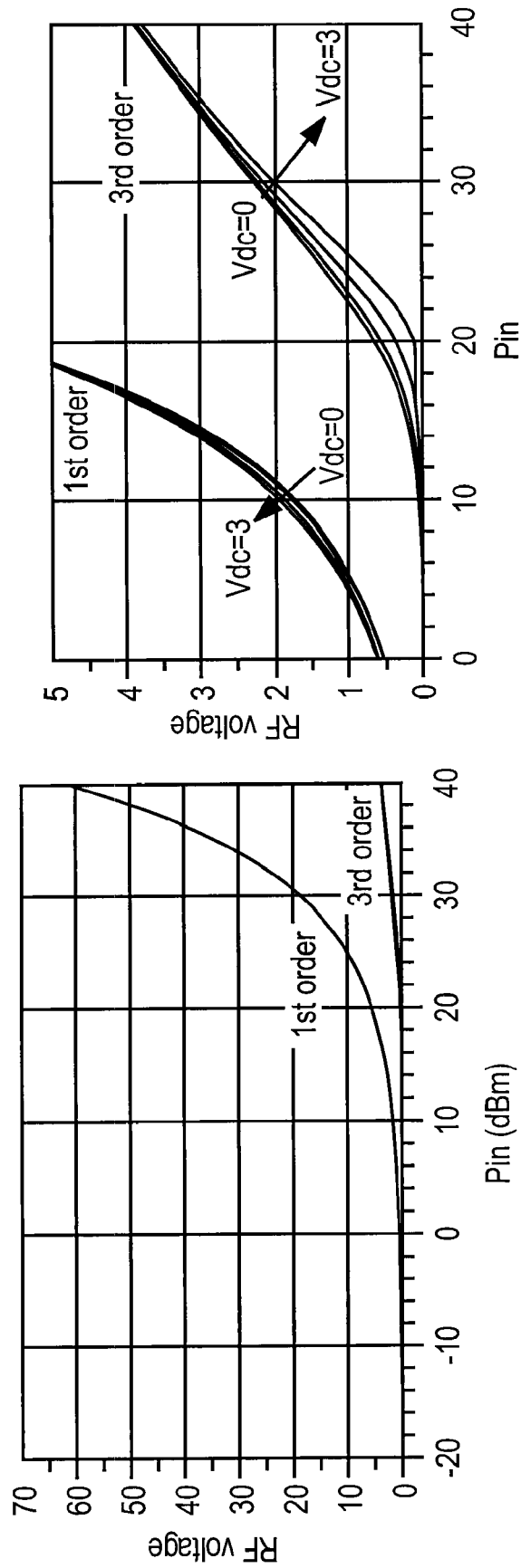

FIGS. 5A–5C are analogous graphs for a different BST varactor design. This BST varactor is tunable over a range of 2.0:1 (i.e., from 2.0 pF to about 1.0 pF) for DC bias voltages ranging from 0 to 3 V. The downward sloping portion of each curve in FIG. 5A is shifted downward in power relative to the curves in FIG. 4A. FIGS. 5B–5C show the nonlinear behavior of the BST varactor. When compared to FIG. 4A, the downward sloping portion of each curve of FIG. 5A decreases at a lower RF input power. This is a consequence of the steeper C(V) curve as a result of fabricating a thinner BST capacitor.

Figure 6A:
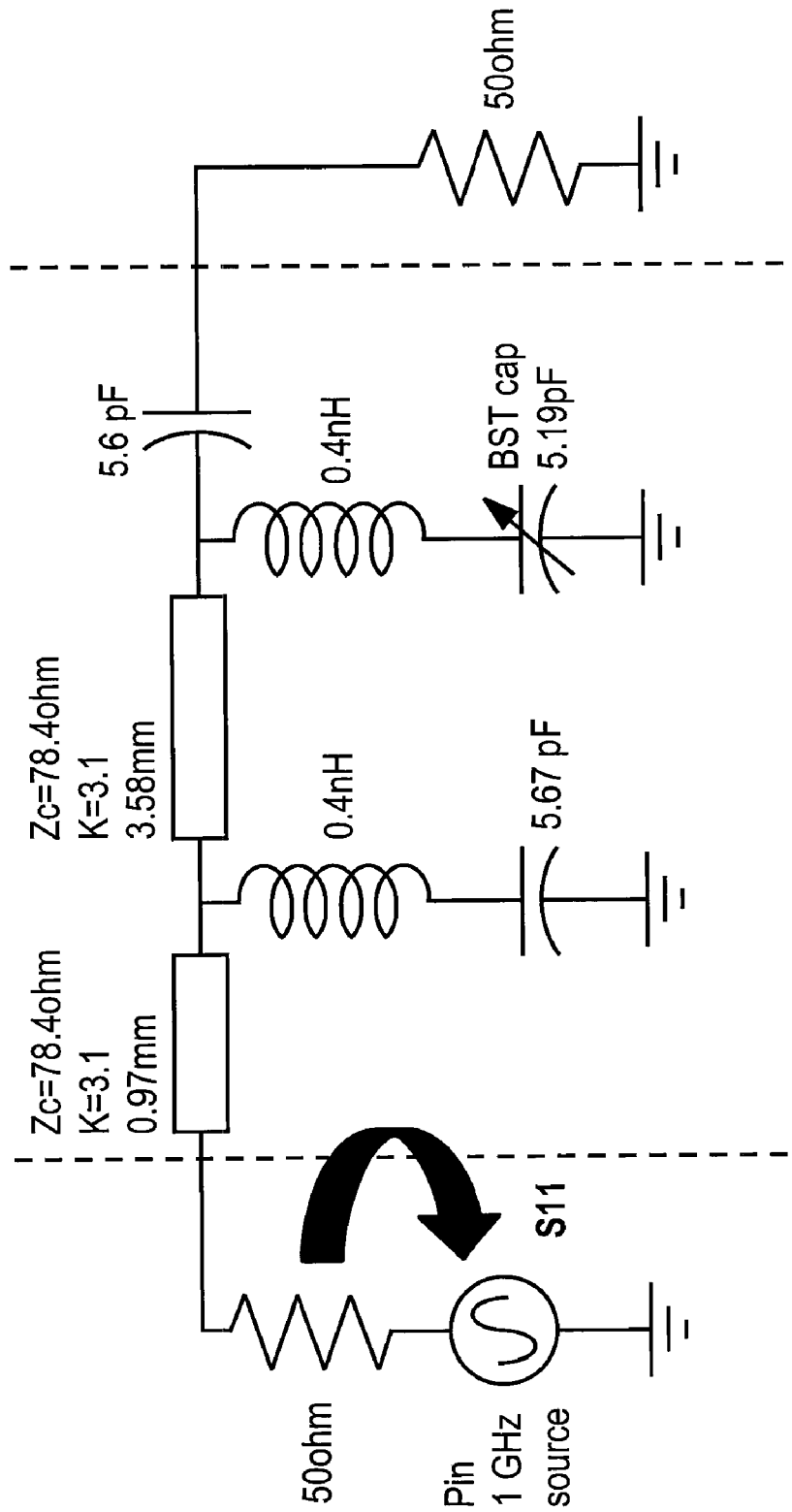
FIG. 6A is a diagram of another example of a self-tuning variable impedance circuit.

FIG. 6A is a diagram of another example of a self-tuning variable impedance circuit. In this example, the matching circuit is coupled to a power amplifier on one end and to a 50 ohm load on the other. The circuit includes two microstrip lines (length 0.97 mm for one and length 3.58 mm for the other, with width and thickness designed for a nominal characteristic impedance of 78.4 Ω on a dielectric with a relative dielectric constant ($\epsilon_r$)of 3.1) and a fixed 5.6 pF capacitor coupled between the power amplifier and the load. It also includes two branches each with an inductor and capacitor in series. One branch includes a 0.4 nH inductor coupled in series with a fixed 5.67 pF capacitor. The other includes a 0.4 nH inductor coupled in series with a nominal 5.19 pF BST varactor.

Figure 6B:
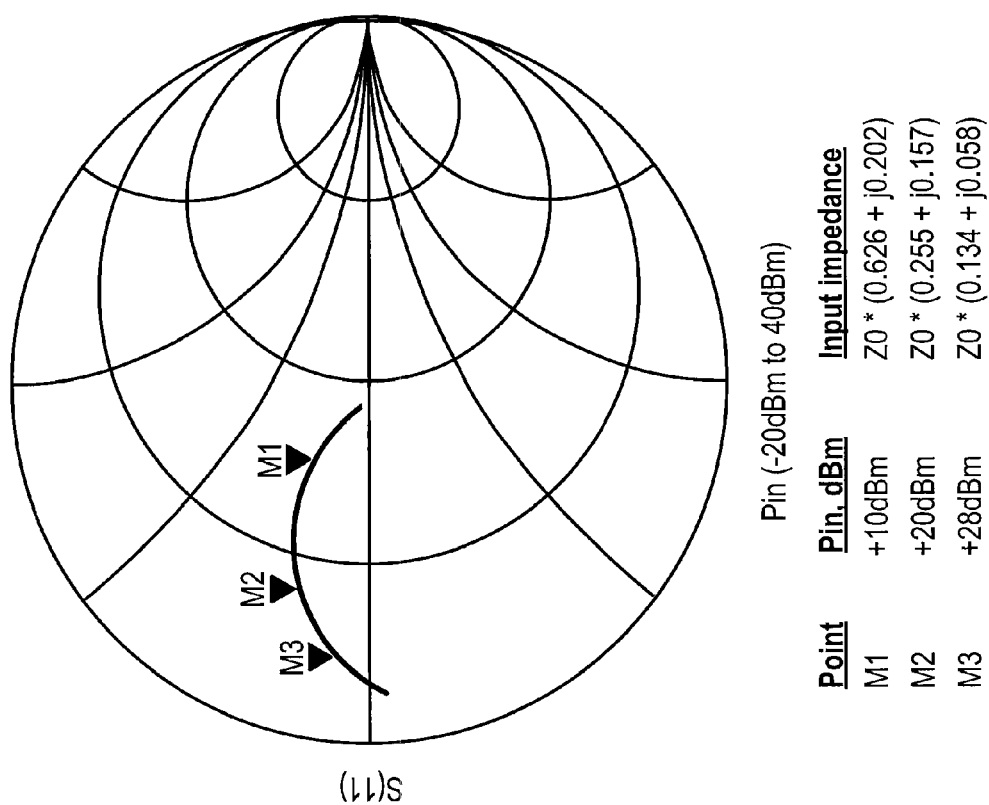
FIG. 6B is a Smith chart illustrating the performance of the circuit of FIG. 6A.

FIG. 6B is a Smith chart illustrating the performance of the circuit of FIG. 6A. The curve 610 maps the impedance of the variable impedance circuit as a function of the applied RF power at a frequency of 1.88 GHz. The curve 610 corresponds to a power range of −20 dBm to +40 dBm. The table in FIG. 6B shows specific impedances for points M1, M2 and M3. The impedance decreases as the RF power increases, providing a near-optimal match over the given power range. In this way, the variable impedance circuit self-tunes itself to match the output power of the amplifier, thus increasing efficiency without additional circuitry.

FIGS. 7–9 illustrate three different examples for fabricating BST (barium strontium titanate) parallel plate capacitors suitable for use according to the invention. Each individual figure shows a different phase of fabrication and each sequence of figures shows the overall fabrication process. Each figure shows both a top view and a corresponding cross-sectional view A—A of the capacitor during fabrication. The fabricated capacitor is shown in the last figure of each sequence. The capacitor is integrated on a substrate 100 and includes a bottom electrode 110, a top electrode 130 and a BST thin film dielectric region 120 sandwiched between the top electrode and the bottom electrode. The active region 150 of the capacitor is defined by the overlap between the top electrode 130, the dielectric region 120 and the bottom electrode 110.

FIGS. 7–9 show the most relevant structures 110, 120, 130 of the capacitor, but this does not imply that other structures or layers do not exist. For example, additional layers located between those shown may be used for various purposes according to conventional techniques. Examples include layers to increase adhesion, to provide a diffusion barrier, or to improve the Schottky barrier height. As another example, the bottom electrode 110 is always shown as supported directly by the substrate 100. This is for convenience, and other layers or structures can be located between the bottom electrode 110 and the substrate 100. In addition, each layer 110, 120, 130 can also include one or more types of materials, although they are shown and will be described as single layers of material in the following examples.

One advantage of using BST as a dielectric material is that BST thin-film materials have a high intrinsic capacitance density. As a result, capacitors of a given capacitance can be realized by small active regions compared to other technologies. In addition, the BST dielectric region 120 can be voltage-variable since the BST dielectric material has a field-dependent electrical permittivity. Thus, the capacitance of the varactor can be changed by changing a DC bias voltage applied across the BST dielectric region 120. For example, changing the bias voltage applied across the two electrodes 110,130 changes the electric field within the dielectric region 120. This, in turn, changes the dielectric constant of the BST material, thus changing the capacitance of the varactor. The BST thin film dielectric region 120 preferably exhibits a field-dependent permittivity in a (non-hysteretic) paraelectric state over a useful temperature range (e.g., −30 C. to +90 C.).

While specific numbers will vary by application, 2:1 capacitance variations and capacitances in the range of 0.01 pF to 10 nF are not unheard of. Similarly, DC control voltages may be in the range of −100 to +100 volts, depending on the BST film thickness and the specific application. The varactors preferably are operated at voltages that are less than half their intrinsic breakdown voltage.

Examples of suitable BST thin film materials for dielectric region 120 include barium titanate, strontium titanate, and composites of the two. For convenience, the term "BST" shall be used throughout to refer to all of these materials even though, strictly speaking, barium titanate does not contain strontium and strontium titanate does not contain barium. The terms "barium titanate", "strontium titanate", and "barium strontium titanate" shall be used to refer to the specific materials. This is strictly for convenience, in order to avoid having to repeat the phrase "barium titanate, strontium titanate and/or barium strontium titanate" throughout. The BST materials can also include small concentrations of one or more dopants to modify certain properties.

To reduce costs, temperature resistant, inexpensive insulating substrates 100 are usually preferred, including but not limited to high-resistivity silicon (HR Si), crystalline sapphire ($Al_2O_3$), aluminum nitride (AlN), quartz and glass. These substrates are preferably polished for low surface roughness for compatibility with growth of smooth ferroelectric films with high breakdown fields. This approach results in low-cost, small size, reliable components which are suitable for mass production and for integration with other circuit elements.

A thin-film capacitor is attractive because it can be easily integrated alongside other active and passive electrical components on many different host substrates, including semiconductors (such as silicon, gallium arsenide, silicon carbide, gallium nitride, etc.) and insulators (such as glass, quartz, sapphire, etc.). However, processing steps for BST thin films can require conditions that limit the choice of materials for the electrodes and other structures. For example, the growth of BST thin films can require high temperature processing that limits electrode materials (at least for the materials that are present when the high temperature processing occurs) to those that have high melting points and that also do not oxidize easily. Examples of such materials include platinum and other refractory metals such as palladium and tungsten, but generally exclude commonly used conductors such as gold, copper and aluminum. Other suitable materials can include other noble metals and conductive oxides. Unfortunately, materials such as platinum typically have higher resistivity and can also be quite expensive. In some cases, the electrode can be shaped to reduce resistance. For example, an electrode that is narrow in the active region can open up into a wide area that has significantly less resistance compared to the narrow portion. Alternately, the electrodes can contact other layers that have better conductivity, for example thick gold layers that are formed after the BST processing steps are completed.

FIGS. 7A–7D are pairs of top view and cross-sectional view, illustrating one fabrication process for a BST parallel plate capacitor. Referring first to the finished capacitor shown in FIG. 7D, the bottom electrode 110 contacts a conducting layer 190 (shown as 190A–190B in the cross section). The crosshatched active region 150 is defined by the lateral overlap of the bottom electrode 110, the BST thin film dielectric region 120 and the top electrode 130. The bottom electrode 10 is platinum in this example in order to withstand the high temperatures used during growth of the BST thin film 120. The conducting layer 190 is a thick metal layer, gold in this example, that provides electrical connection with reduced resistance to the bottom electrode 110. The top electrode 130 can be formed from the same thick metal layer as layer 190 or a separately deposited layer. In this example, it is the same gold layer. A passivation structure 140 covers the BST dielectric region 120. Here, the passivation structure 140 is silicon nitride that is sputtered onto the device, although other materials including oxides (e.g., $Al_2O_3$ and $SiO_2$) can be used.

In the top view, visible structures are shown by solid lines and hidden structures by dashed lines. The lead line for the reference numeral (except for 150) contacts the border for that structure and the reference numeral is placed in the interior of the structure. For example, the lead line for 110 (bottom electrode) contacts a rectangular border and the reference numeral is located on the inside of the rectangle. Therefore, the bottom electrode 100 is rectangular in shape. If the reference numeral 110 were located on the outside of the rectangle, then the lateral shape of the structure would be a solid sheet with a rectangular hole in it. The dashed border means the bottom electrode 110 is hidden in this view. That is, it is located under other structures.

Figure 7A:
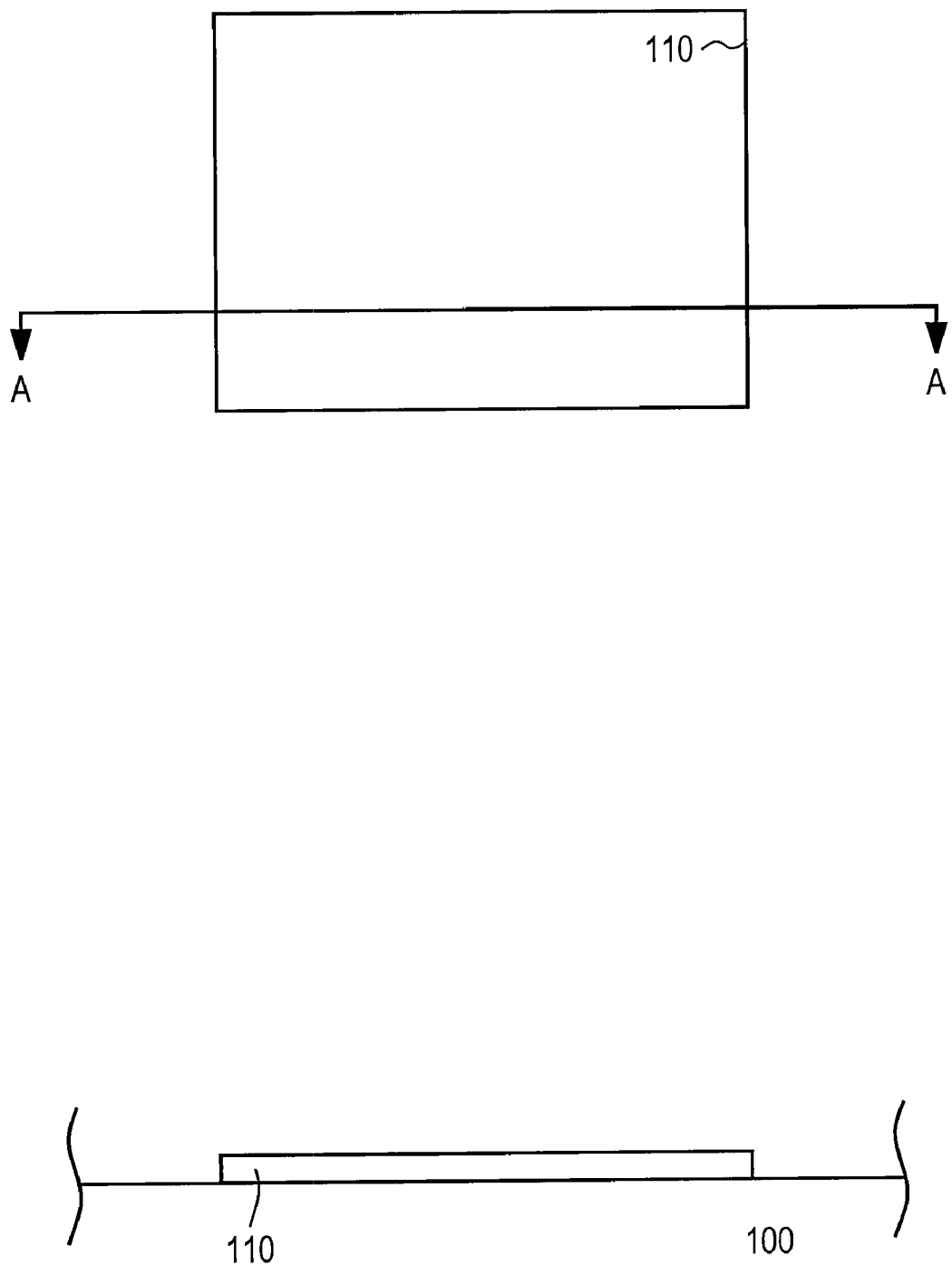
FIGS. 7A–7D are top view and cross-sectional view pairs, illustrating a fabrication process for BST parallel plate capacitors.
Figure 7B:
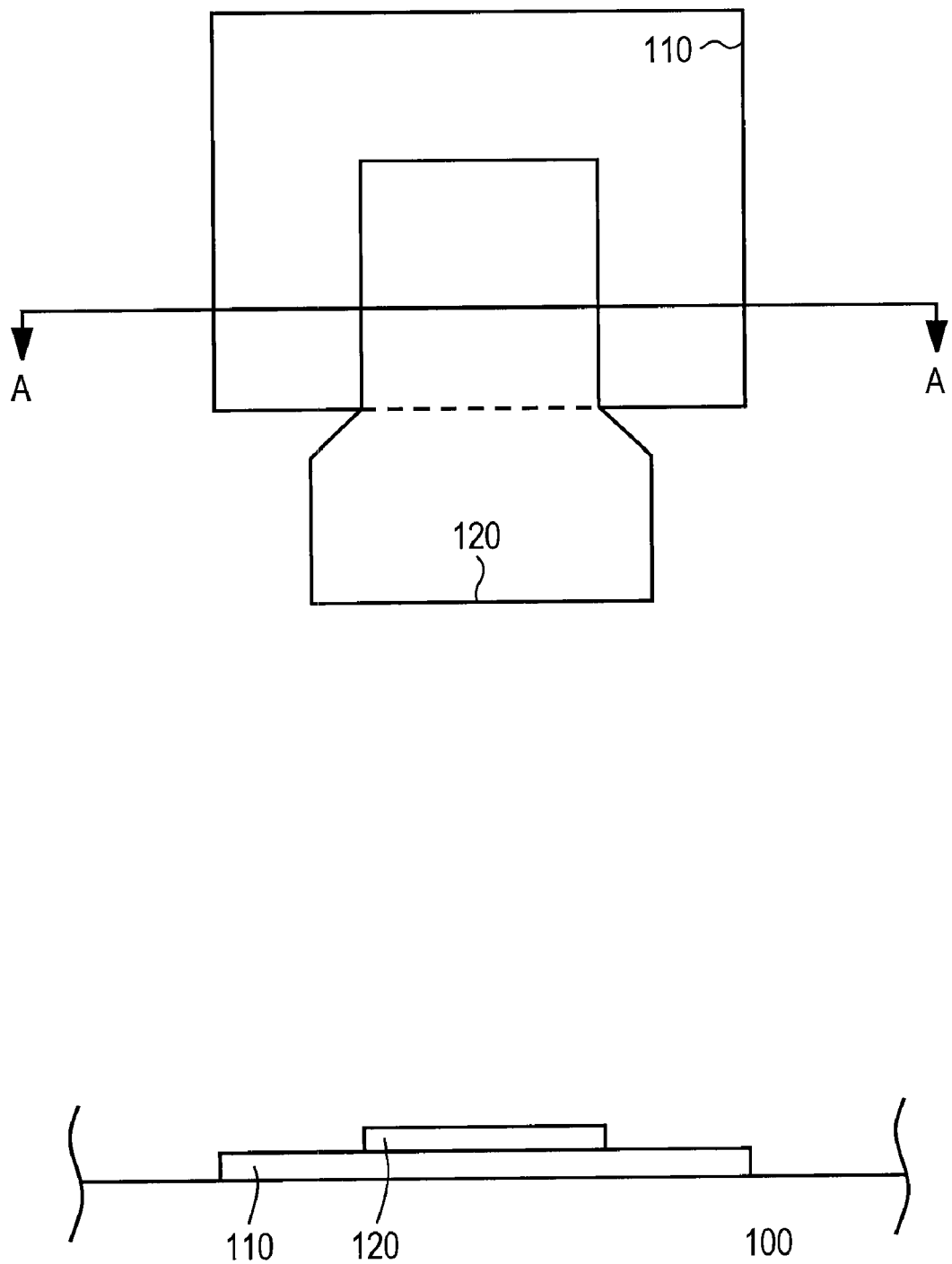
Figure 7C:
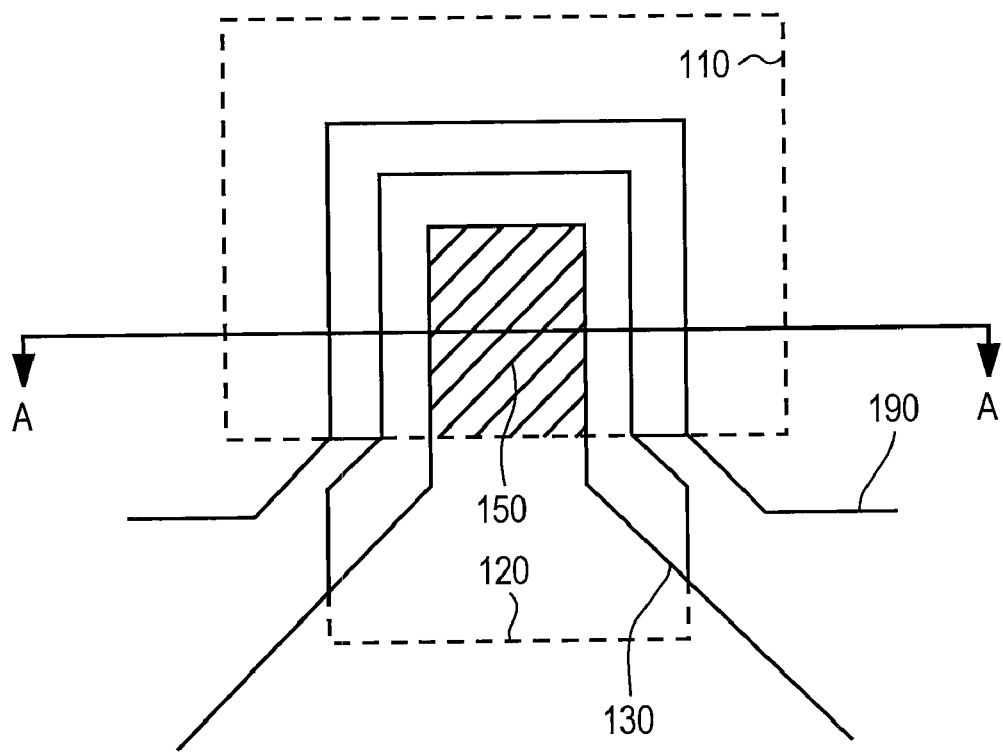
Figure 7C:
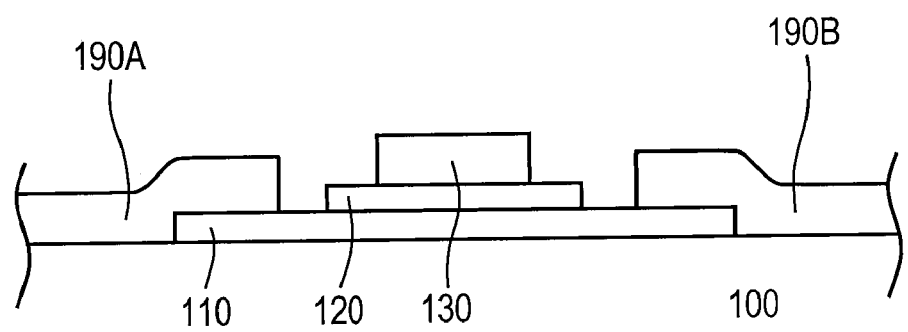
Figure 7D:
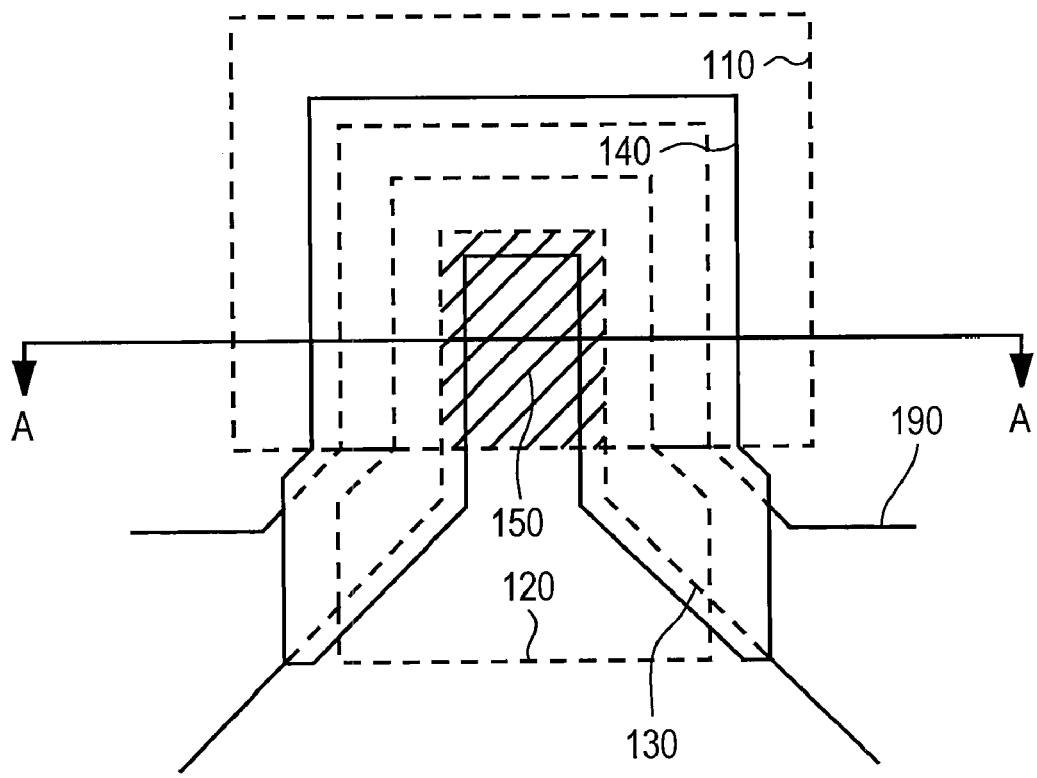
Figure 7D:
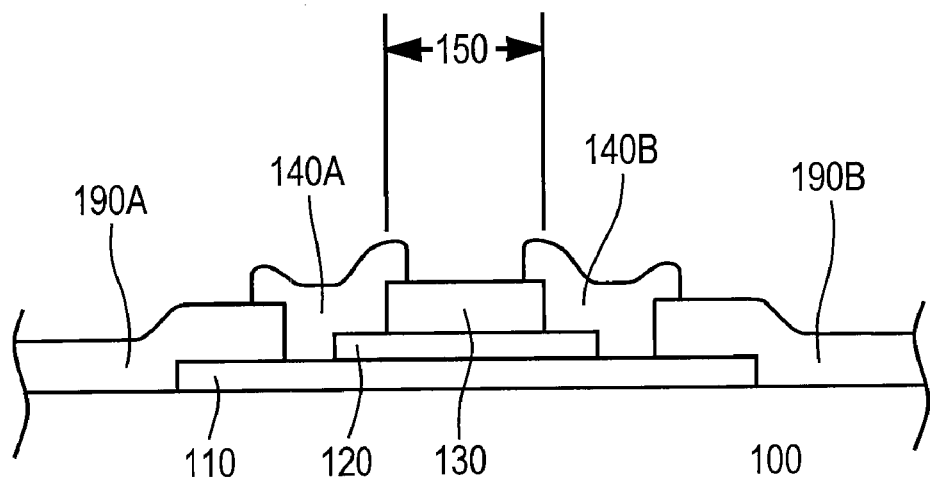

In the top view of FIG. 7D, the passivation structure 140 is fully visible. The top electrode 130 and the conducting layer 190 are also fully or mostly visible. The passivation structure 140 slightly overlaps the top electrode 130, and these two structures together cover the BST thin film dielectric region 120. The dielectric region 120 is an eight-sided shape that is shown as dashed in the top view since it is hidden by the top electrode 130 and passivation structure 140. Five of the eight sides are obscured by the passivation structure 140, two of the eight sides are obscured by both the passivation structure 140 and the top electrode 130, and one side is obscured by top electrode 130. The bottom electrode 110 is rectangular in shape and is entirely hidden in the top view. The overall structure of the capacitor will be more apparent when the fabrication process is described.

Turning now to fabrication, the bottom electrode 110 is formed on substrate 100. This includes forming the lateral shape of the electrode 110, as shown in FIG. 7A. In one approach, a layer of material for the bottom electrode is formed over the substrate 100. Selected lateral portions of the bottom electrode layer are then removed, for example by etching, thus forming the lateral shape of the bottom electrode 110. In an alternate approach, a lift off process is used. A lift off mask that defines the lateral shape of the bottom electrode 110 is formed over the substrate. A layer of bottom electrode material is deposited over the lift off mask. Removing the lift off mask also removes the bottom electrode material in certain areas, thus forming the lateral shape of the bottom electrode 10.

In one particular embodiment of this design, the substrate 100 is sapphire and the bottom electrode 110 is a thin layer of platinum. Platinum is selected for compatibility with the BST processing. A thin layer is preferred because it does not become as rough during the subsequent BST high temperature growth steps, resulting in better BST film and interface quality. A lift off approach is used because it can produce thicker bottom electrodes 110 and results in cleaner surfaces. It also avoids having to etch platinum. Specifically, a patterned photoresist layer is deposited over the substrate 100. A thin layer of titanium is evaporated on top of this to function as an adhesion layer, and platinum is deposited on top of the titanium. Removing the photoresist lift off mask leaves the platinum bottom electrode 110 shown in FIG. 7A. Other patterning techniques can be used, for example etching the platinum layer to form the bottom electrode 110.

Referring to FIG. 7B, the BST thin film dielectric region 120 is formed over the bottom electrode 110. In this example, a BST thin film is grown on top of the platinum electrode 110. The film is patterned and the thin film located in unwanted regions is etched away, resulting in the dielectric region 120 shown in FIG. 7B. Conventional BST growth and patterning techniques are used. The dielectric region 120 overlaps the bottom electrode 110, as shown in FIG. 7B.

Note that BST material is produced over the bottom electrode 110 only after the lateral shape of the platinum electrode 110 is formed. This is beneficial because it reduces the amount of processing to which the BST material is exposed. Exposure to less processing generally results in higher quality material (i.e., less degradation of the BST material properties).

Referring to FIG. 7C, a top electrode 130 is formed over the BST thin film dielectric region 120. In this example, a gold layer is deposited and patterned to form both the top electrode 130 and the conducting layer 190 shown in FIG. 7C. The gold conducting layer 190 overlaps with the platinum bottom electrode 110, thus providing a low resistance electrical path to the platinum electrode 110. It is advantageous to place the gold conducting layer 190 in close proximity to the active region 150, in order to reduce the overall resistance resulting from the platinum electrode 110. In an alternate embodiment, platinum is used to form the top electrode 130. One advantage of platinum is that it forms a high quality interface with the BST thin film. Another advantage is that it can better withstand the subsequent BST annealing process.

The passivation structure 140 is also formed over the BST thin film dielectric region 120, as shown in FIG. 7D. The material for passivation structure 140 is produced over the BST material only after the interface between the top electrode 130 and the BST material 120 has been formed. In this example, the silicon nitride material for the passivation structure 140 is deposited after the gold for top electrode 130.

In one approach, the BST thin film is grown and patterned to form the BST thin film dielectric region 120. Gold for the top electrode 130 is then deposited and patterned. For example, a wet etch that attacks gold but not BST can be used to form the lateral shape of the top electrode 130. Examples of etchants include iodine-based gold etchants. Then, material for the passivation structure 140 is deposited.

After BST processing is completed, standard annealing techniques typically are used to improve the quality of the BST materials, for example by repairing damage which may occur during BST processing steps. Annealing can also improve the quality of the interface between the BST material and the electrodes.

FIGS. 8 and 9 illustrate additional variations of the fabrication process, using specific designs as examples. In FIG. 8, there is one capacitor, but as shown in the cross section of FIG. 8E, the electrical contact 190A to the bottom electrode 110 extends to one side and the electrical contact 190B to the top electrode 130 extends to the other side. This is a different geometrical layout than the one shown in FIG. 7.

In FIG. 9, there are two capacitors, as shown by the two active areas 150A and 150B. A platinum layer serves as a common bottom electrode 110 for both capacitors, thus coupling the capacitors in series. For ease of fabrication, a single BST thin film serves as the dielectric region 120 for both capacitors. However, there are two separate top electrodes 130A,130B, which serve as the two terminals to the series-coupled capacitors. Alternately, the two capacitors can be coupled in parallel by using the bottom electrode 110 as one terminal and by coupling the two top electrodes 130A,B together as the other terminal.

Figure 8A:
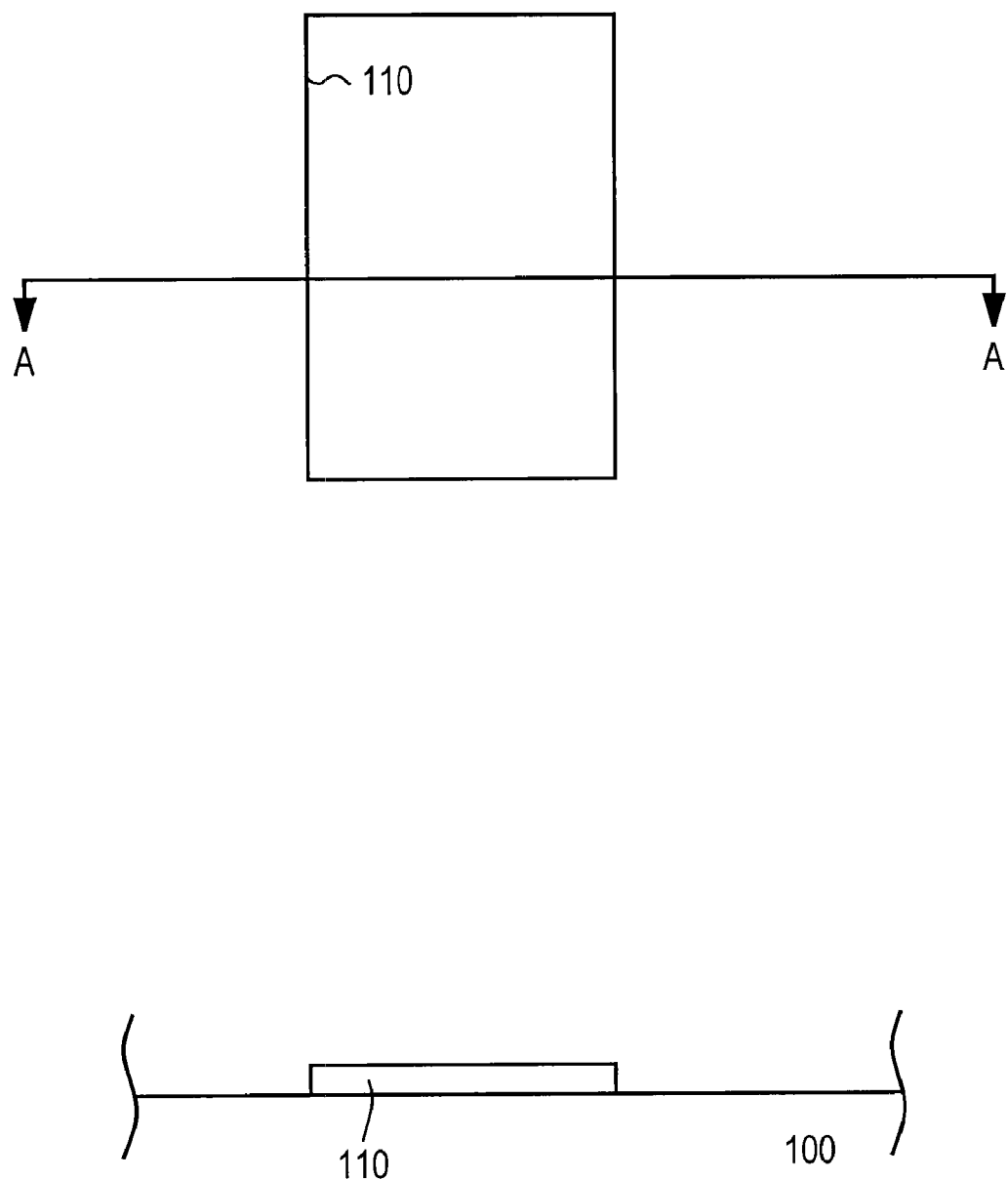
FIGS. 8A–8E are top view and cross-sectional view pairs, illustrating another fabrication process for BST parallel plate capacitors.
Figure 8B:
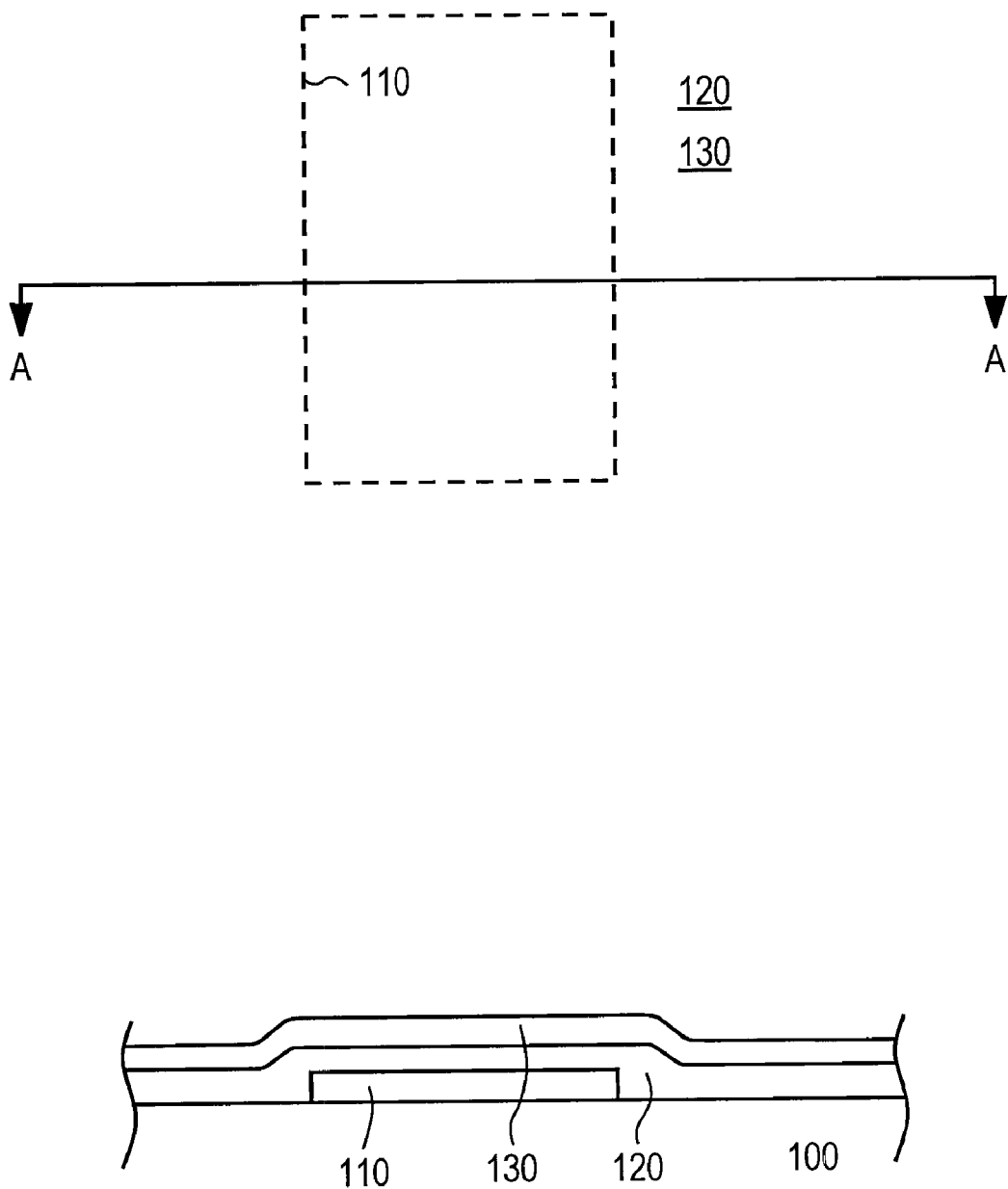
Figure 8C:
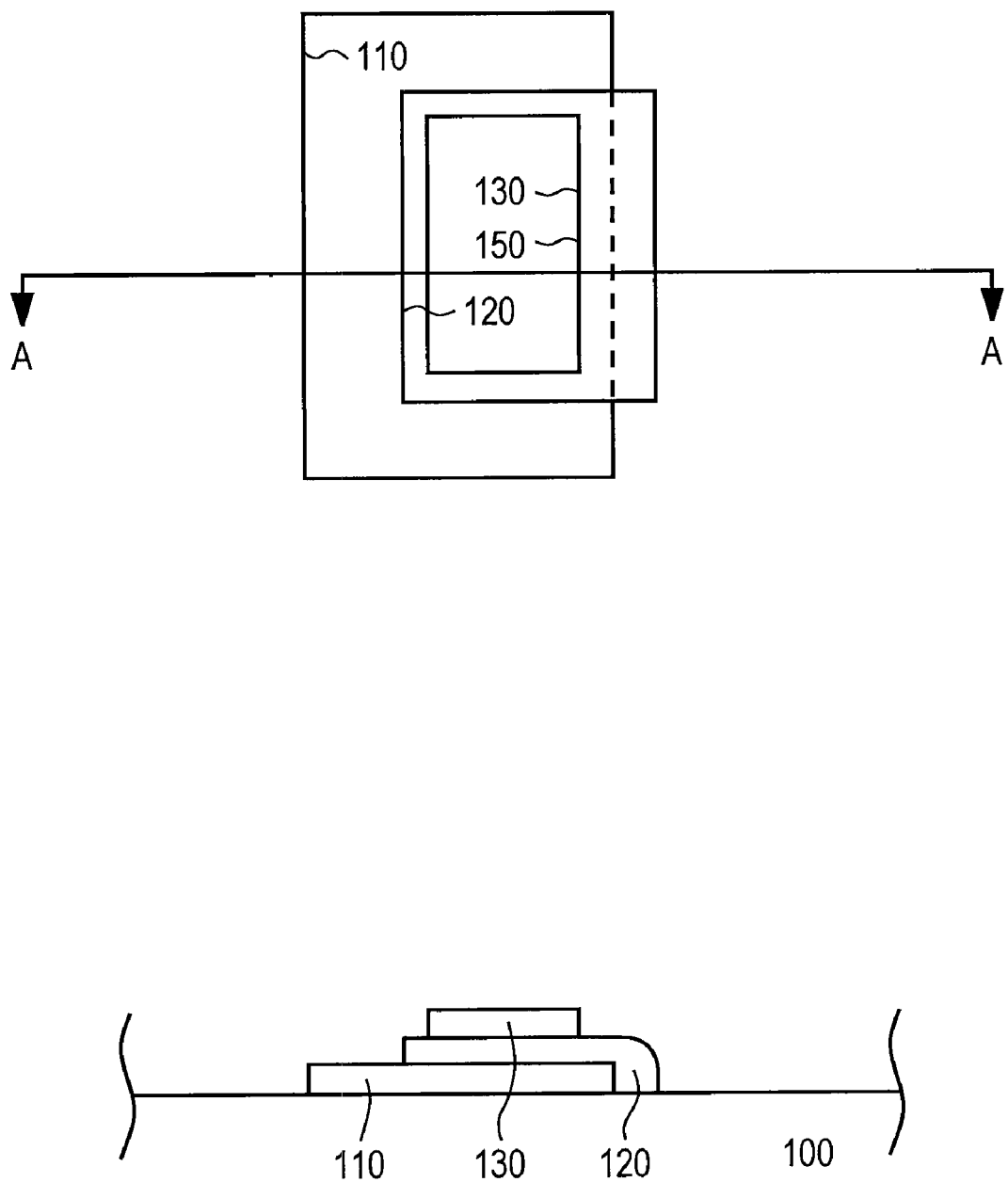
Figure 8D:
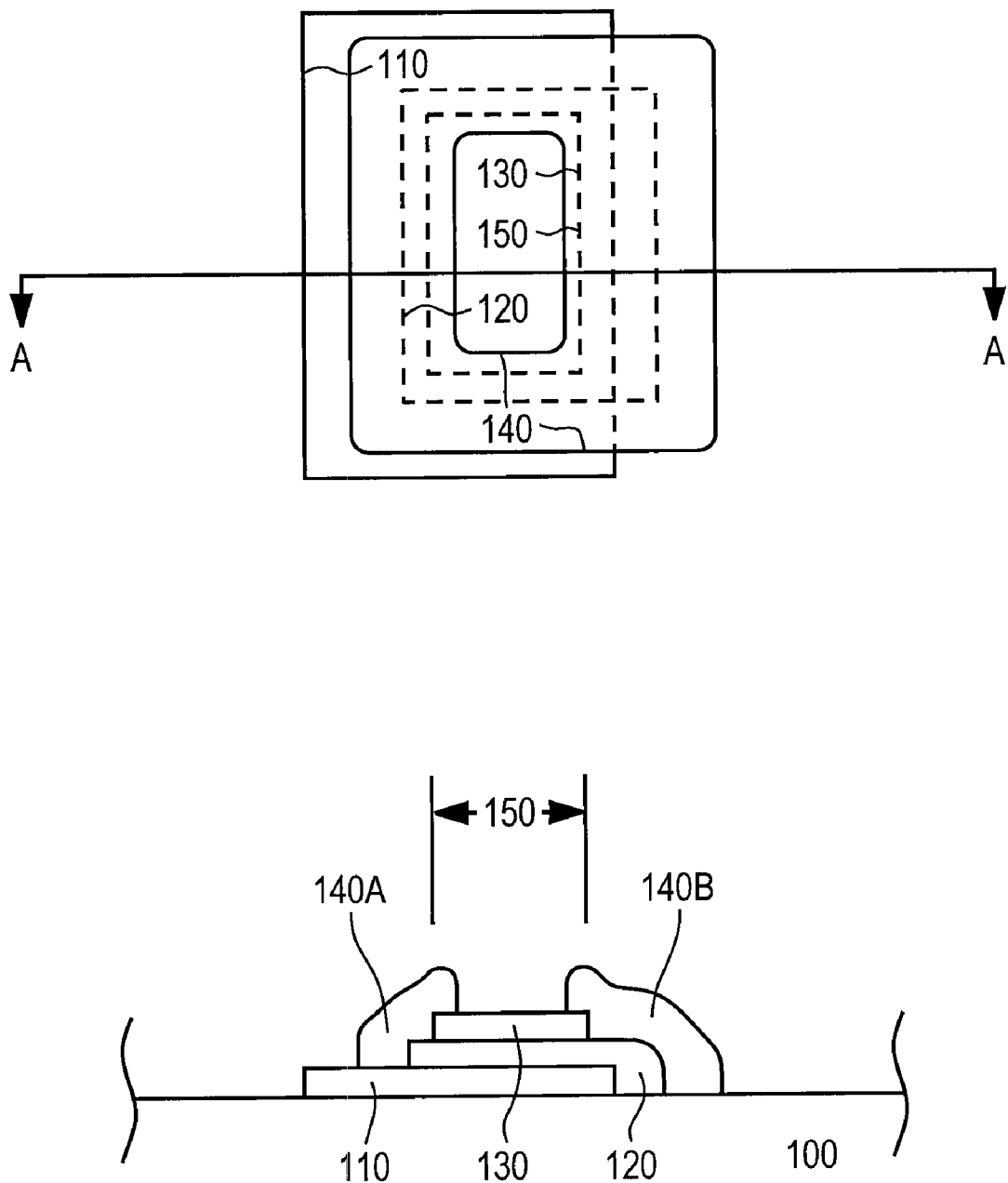
Figure 8E:
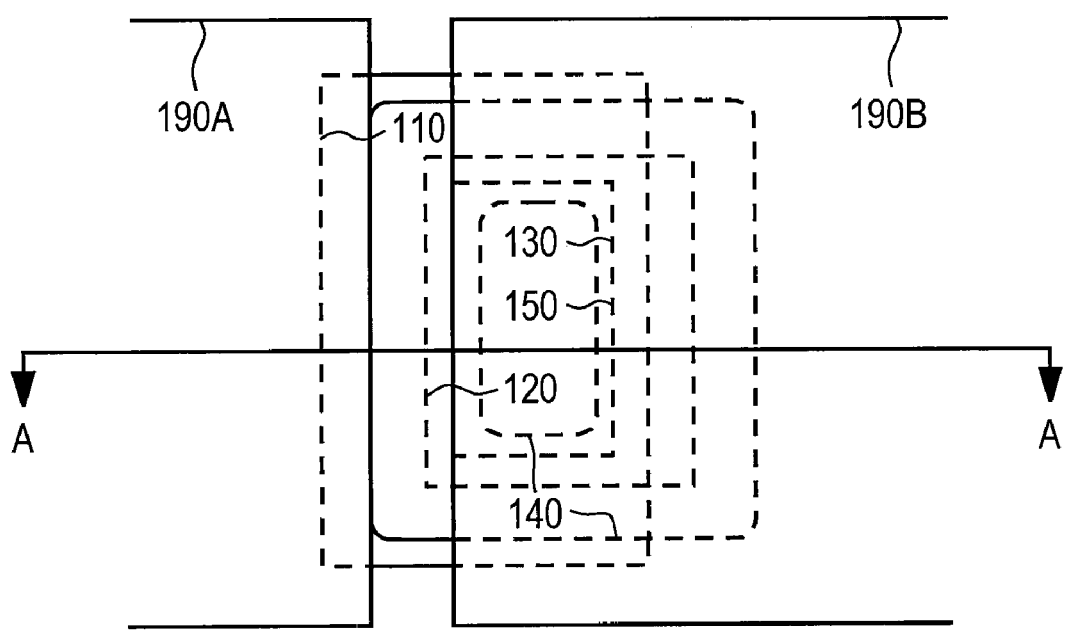
Figure 8E:
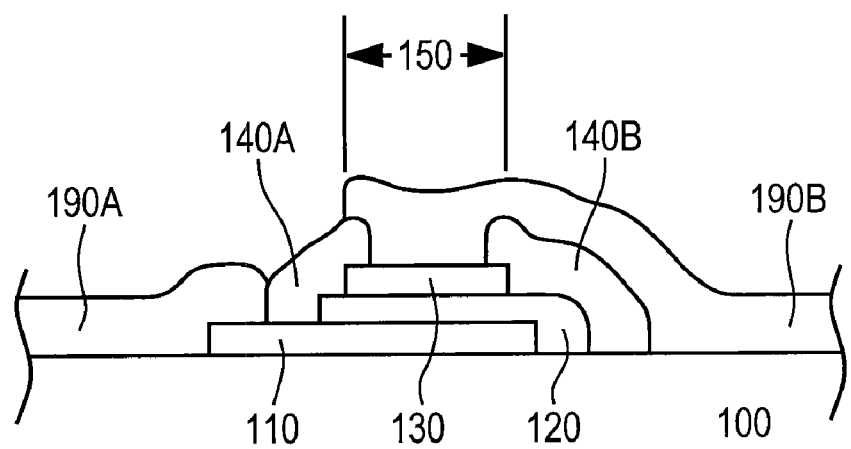
Figure 9A:
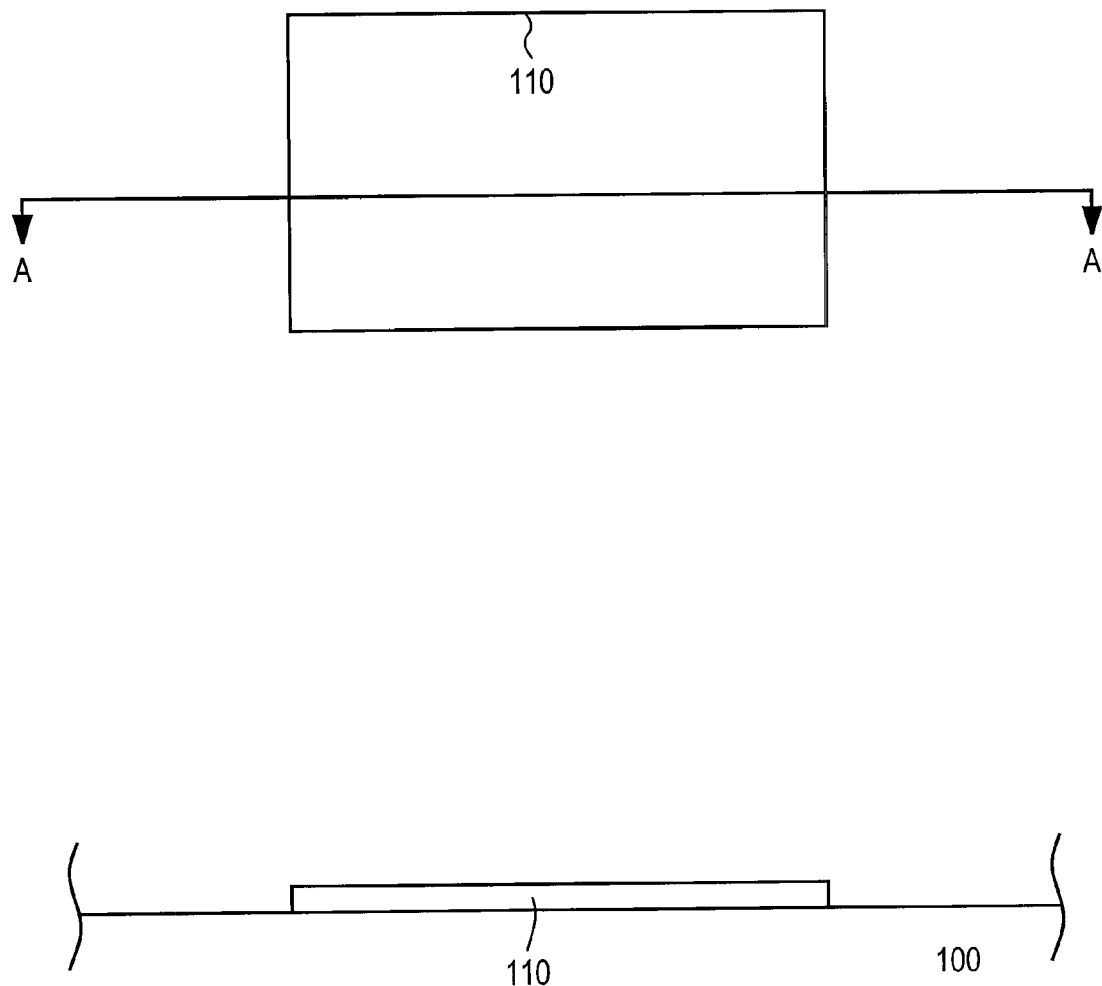
FIGS. 9A–9E are top view and cross-sectional view pairs, illustrating yet another fabrication process for BST parallel plate capacitors.
Figure 9B:
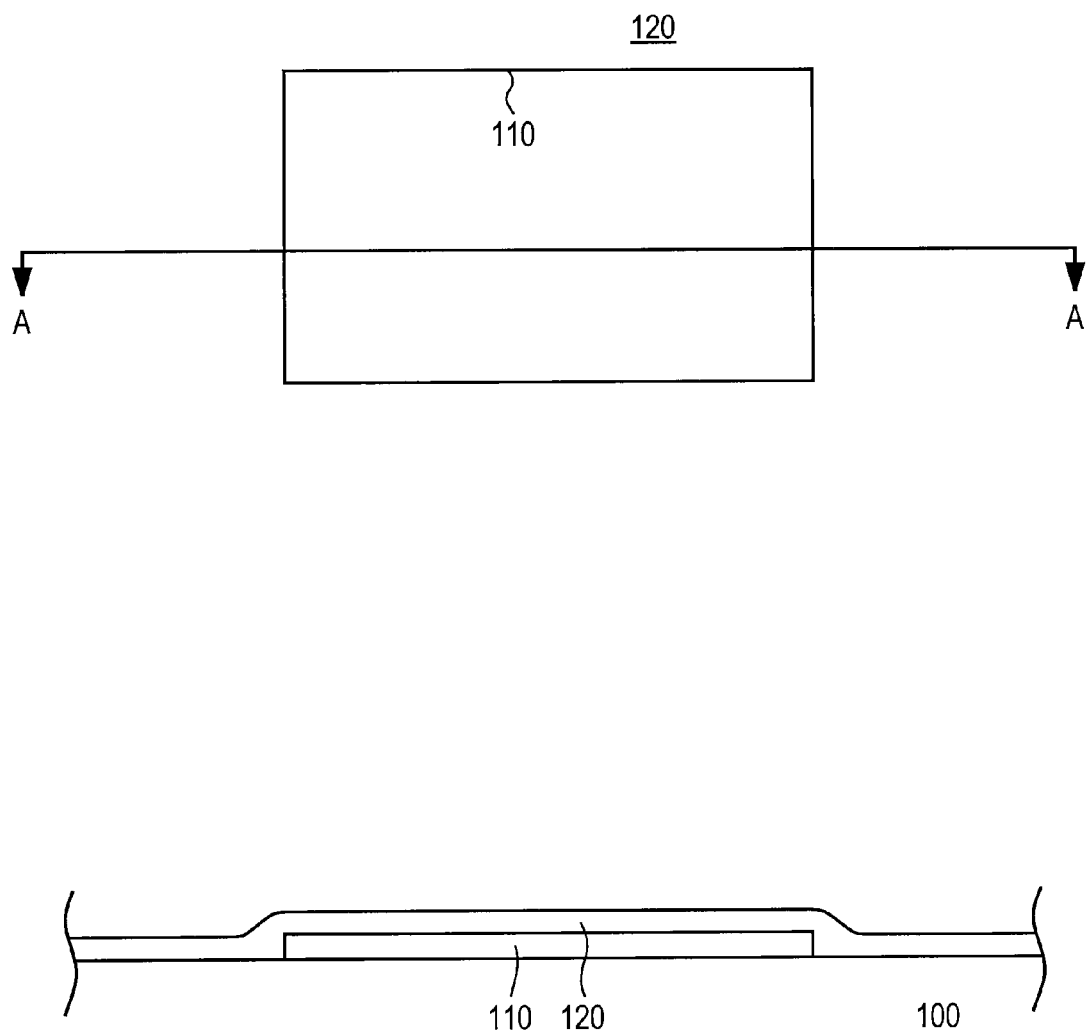
Figure 9C:
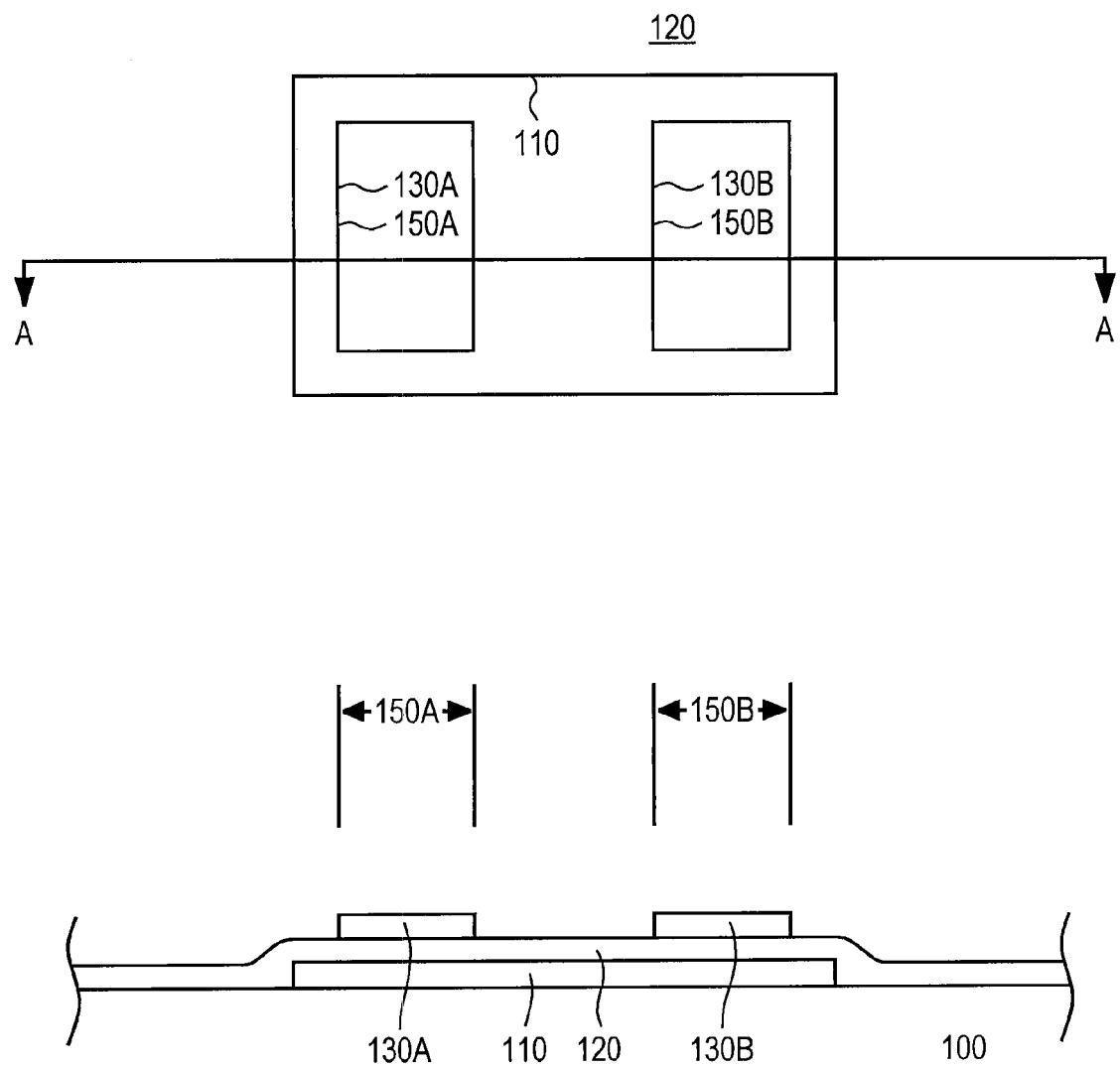
Figure 9D:
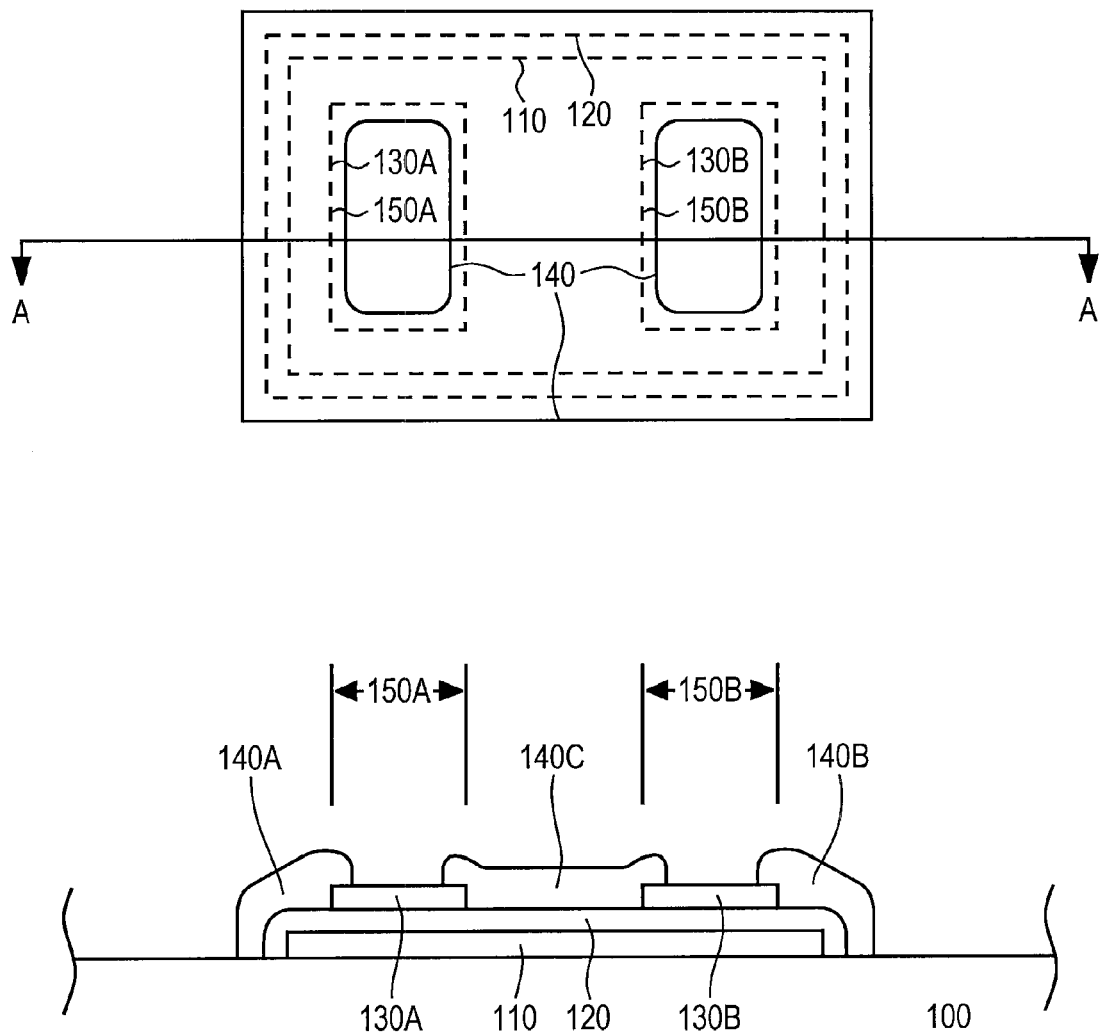
Figure 9E:
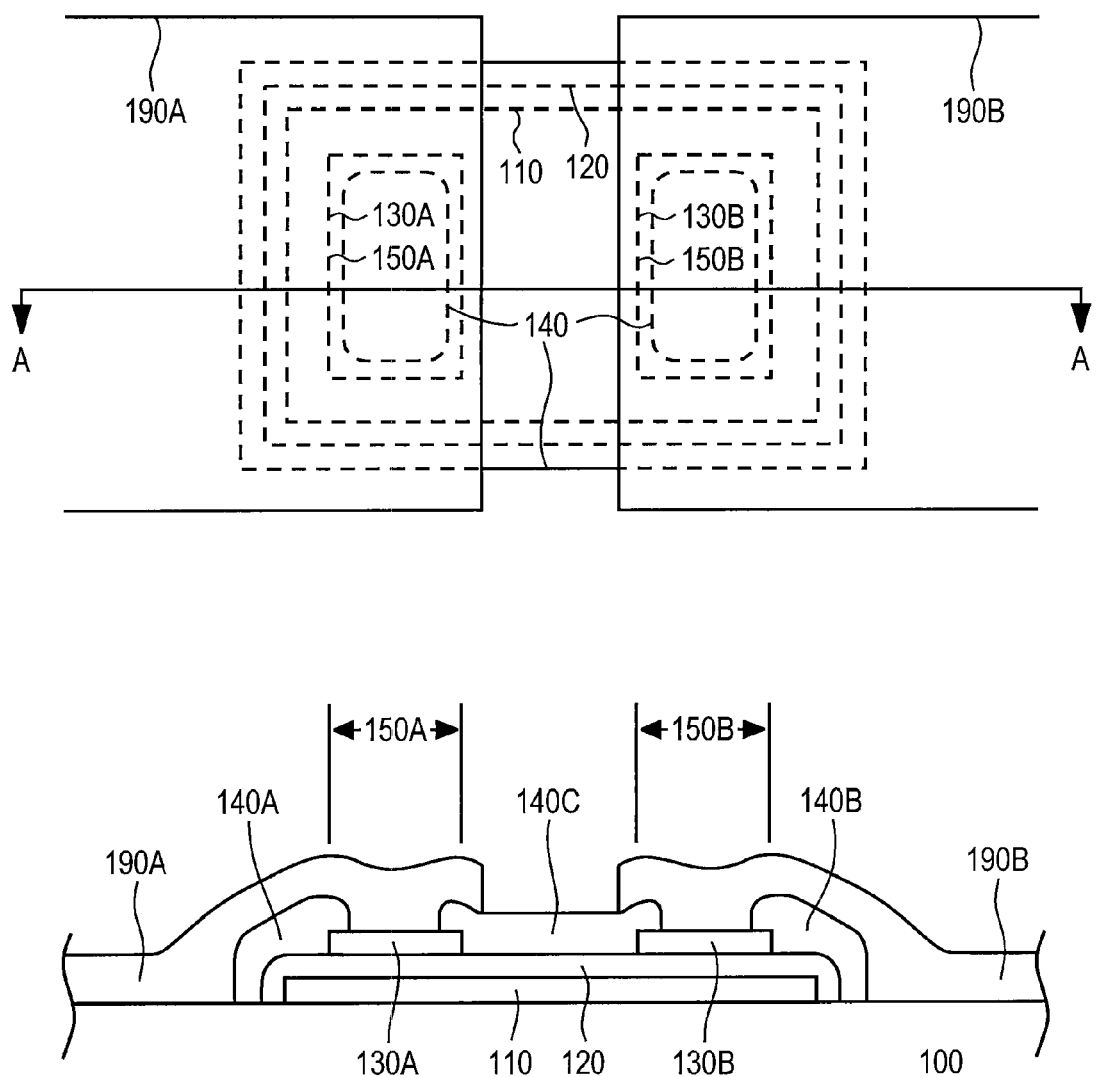

Referring to FIGS. 8E and 9E, another difference compared to FIG. 7 is that the top electrode 130 is deposited and then followed by a separately deposited conducting layer 190. In FIG. 7, the top electrode 130 is not a separate layer from the remainder of the electrical contact. FIGS. 6 and 7 also use a different order of processing steps to form the BST thin film dielectric region 120 and top electrode 130, as will be further discussed below. In FIG. 9, the bottom electrode 110 and BST thin film dielectric region 120 are the same size and shape.

In more detail, both FIGS. 8A and 9A show the capacitor after the bottom electrode 110 is formed on substrate 100. This process is analogous to what is shown in FIG. 7A.

Referring to FIGS. 8B–8C, the BST thin film dielectric region 120 and top electrode 130 are formed, but using a different order for process steps than shown in FIGS. 7B–7C. In this example, as shown in FIG. 8B, a BST thin film 120 is grown over the platinum bottom electrode 110 but the lateral shape of the dielectric region (e.g., see 120 in FIG. 8E) is not formed. A platinum layer 130 for the top electrode is deposited over the BST thin film 120. The result is shown in FIG. 8B. The lateral shapes for the BST thin film dielectric region 120 and top electrode 130 are then formed. This can be done in a common process if the BST thin film dielectric region 120 and top electrode 130 have the same shape. Alternately, separate processes can be used, one to form the lateral shape of the top electrode 130 and another for the dielectric region 120. In one approach, a selective etch is used to form the lateral shape of the top electrode 130. This is followed by an etch that forms the lateral shape of the BST dielectric region 120. The result is shown in FIG. 8C.

In FIGS. 9B–9C, the BST thin film dielectric region 120 and top electrode 130 are formed in yet a different manner. Specifically, BST material is grown over bottom electrode 110 but the lateral shape of the dielectric region is not formed. Then, the platinum top electrode 130 is formed using a lift off process, as shown in FIG. 9C. The lateral shape of the BST thin film 120 is then formed.

Referring to FIGS. 8D and 9D, the passivation structure 140 is formed over the BST thin film dielectric region 120. In FIG. 8D, the passivation structure 140 has an annular lateral shape, as indicated by the lead line from reference numeral 140 contacting two separate borders. The center hole in the passivation structure 140 gives access to the top electrode 130, as can be seen from the cross section. In FIG. 9D, the passivation structure 140 has two holes, one for each top electrode 130A,130B. As in FIG. 7, the BST material is covered by a combination of the top electrode 130 and the passivation structure 140.

Referring to FIGS. 8E and 9E, the conducting layer 190 is formed. In FIG. 8E, the conducting layers 190A,B make contact to the top electrode 130 and bottom electrode 110, respectively. In FIG. 9E, the conducting layers 190A,B contact the two top electrodes 130A,B. In FIG. 8E, an additional capacitor is formed by the conducting layer 190B as one electrode, the bottom electrode 110 as the other electrode and the BST thin film 120 and passivation structure 140B as the dielectric. This capacitor is in parallel with the BST capacitor defined by active area 150 and adds to its capacitance. As a result, it is usually desirable for the passivation material to have a dielectric constant that is significantly less than that of the BST thin film so that the active region 150 dominates the overall capacitance.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents. Furthermore, no element, component or method step is intended to be dedicated to the public regardless of whether the element, component or method step is explicitly recited in the claims.

What is claimed is:

1. An impedance matching circuit for impedance matching a power amplifier, the impedance matching circuit comprising a self-tuning BST parallel plate varactor, wherein an RF output power of the power amplifier induces a change in capacitance of the BST parallel plate varactor, thereby causing the impedance matching circuit to better match the power amplifier, and wherein an increase in the RF output power of the power amplifier induces a decrease in the capacitance of the BST parallel plate varactor.

2. The impedance matching circuit of claim 1 wherein an increase in a voltage applied to the BST parallel plate varactor causes an increase in an electric field within the BST parallel plate varactor, which causes the decrease in the capacitance of the BST parallel plate varactor.

3. The impedance matching circuit of claim 2 wherein the voltage applied to the BST parallel plate varactor is an RF voltage, and the decrease in the capacitance of the BST parallel plate varactor results in an increase in RF power efficiency of the power amplifier.

4. The impedance matching circuit of claim 2 wherein the decrease in the capacitance of the BST parallel plate varactor is a result of a nonlinear behavior of the BST.

5. The impedance matching circuit of claim 1 further comprising:
   a first node for coupling to the power amplifier;
   a second node for coupling to a load; and
   a passive circuit coupled between the first node and the second node, the passive circuit including the BST parallel plate varactor.

6. The impedance matching circuit of claim 1 wherein the power amplifier receives and amplifies a wireless signal.

7. The impedance matching circuit of claim 6 wherein the wireless signal is a modulated RF signal.

8. The impedance matching circuit of claim 1, wherein the power amplifier receives and amplifies a RF signal.

9. The impedance matching circuit of claim 1, wherein the power amplifier and the BST parallel plate varactor are integrated on a common substrate.

10. The impedance matching circuit of claim 5 wherein the BST parallel plate varactor is coupled between the second node and a remainder of the passive circuit.

11. The impedance matching circuit of claim 5 wherein the passive circuit comprises:

a third node;

a first strip line coupled between the first node and the third node;

a second strip line and a first capacitor coupled in series between the first node and ground;

a second capacitor coupled between the third node and ground; and wherein the BST parallel plate varactor is coupled between the third node and the second node.

12. The impedance matching circuit of claim 5 wherein the passive circuit comprises:

an intermediate node;

a first set of circuit elements coupled in series between the first node and second node via the intermediate node; and a second set of circuit elements coupled between the intermediate node and ground, the second set of circuit elements including the BST parallel plate varactor.

13. The impedance matching circuit of claim 5 wherein the passive circuit comprises:

a third node and a fourth node;

a first strip line coupled between the first node and the third node;

a second strip line coupled between the third node and the fourth node;

a capacitor coupled between the fourth node and the second node;

a first L-C circuit coupled between the third node and ground; and a second L-C circuit coupled between the fourth node and ground, the second L-C circuit including the BST parallel plate varactor.

14. The impedance matching circuit of claim 1 wherein the BST parallel plate varactor comprises:

a bottom electrode supported by a substrate;

a top electrode; and a BST thin film layer located between the bottom electrode and the top electrode.

15. The impedance matching circuit of claim 14 wherein the bottom electrode comprises a platinum bottom electrode.

16. The impedance matching circuit of claim 15 wherein the BST parallel plate varactor further comprises an adhesion layer between the bottom electrode and the substrate.

17. The impedance matching circuit of claim 14 wherein the BST parallel plate varactor further comprises:

a passivation structure for protecting the BST thin film layer.

18. The impedance matching circuit of claim 1 wherein the BST parallel plate varactor comprises:

a platinum bottom electrode supported by a substrate;

two separated top electrodes; and two BST thin film layers, each BST thin film layer located between the bottom electrode and one of the top electrodes.

* * * * *